（12）United States Patent
Nishimaki et al.

(10) Patent No.: US 12,025,916 B2
(45) Date of Patent: Jul. 2, 2024

(54) RESIST UNDERLAYER FILM-FORMING COMPOSITION THAT CONTAINS TRIARYLDIAMINE-CONTAINING NOVOLAC RESIN TO WHICH AROMATIC VINYL COMPOUND IS ADDED

(71) Applicant: NISSAN CHEMICAL CORPORATION, Tokyo (JP)

(72) Inventors: Hirokazu Nishimaki, Toyama (JP); Daigo Saito, Toyama (JP); Ryo Karasawa, Toyama (JP); Keisuke Hashimoto, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 882 days.

(21) Appl. No.: 16/971,357

(22) PCT Filed: Feb. 20, 2019

(86) PCT No.: PCT/JP2019/006349
§ 371 (c)(1),
(2) Date: Aug. 20, 2020

(87) PCT Pub. No.: WO2019/163834
PCT Pub. Date: Aug. 29, 2019

(65) Prior Publication Data
US 2020/0387072 A1  Dec. 10, 2020

(30) Foreign Application Priority Data

Feb. 20, 2018   (JP) ................. 2018-027571

(51) Int. Cl.
| | | |
|---|---|---|
| G03F 7/11 | (2006.01) | |
| C08L 61/06 | (2006.01) | |
| G03F 7/16 | (2006.01) | |
| G03F 7/20 | (2006.01) | |
| H01L 21/027 | (2006.01) | |

(52) U.S. Cl.
CPC ............ G03F 7/11 (2013.01); C08L 61/06 (2013.01); G03F 7/168 (2013.01); G03F 7/2037 (2013.01); H01L 21/0275 (2013.01)

(58) Field of Classification Search
CPC .......... G03F 7/11; G03F 7/168; G03F 7/2037; G03F 7/094; G03F 7/0045; G03F 7/20; C08L 61/06; H01L 21/0275; H01L 21/0332; H01L 21/027; C08G 12/08; C08G 61/12; C09D 161/22
USPC ................ 430/270.1, 271.1, 272.1
See application file for complete search history.

(56) References Cited

U.S. PATENT DOCUMENTS

| | | |
|---|---|---|
| 2014/0235059 A1 | 8/2014 | Sakamoto et al. |
| 2016/0139509 A1 | 5/2016 | Hashimoto et al. |
| 2016/0266494 A1 | 9/2016 | Kim et al. |
| 2017/0097568 A1 | 4/2017 | Endo et al. |
| 2017/0110328 A1 | 4/2017 | Kwon et al. |
| 2017/0315445 A1 | 11/2017 | Hashimoto et al. |
| 2018/0314145 A1 | 11/2018 | Chang et al. |
| 2019/0067021 A1 | 2/2019 | Kori et al. |
| 2019/0212649 A1 | 7/2019 | Saito et al. |

FOREIGN PATENT DOCUMENTS

| | | |
|---|---|---|
| JP | 2017-078165 A | 4/2017 |
| JP | 2019-041059 A | 3/2019 |
| WO | 2013/047516 A1 | 4/2013 |
| WO | 2014/208542 A1 | 12/2014 |

(Continued)

OTHER PUBLICATIONS

Apr. 23, 2019 Search Report issued in International Patent Application No. PCT/JP2019/006349.

(Continued)

*Primary Examiner* — Caleen O Sullivan
(74) *Attorney, Agent, or Firm* — Oliff PLC

(57) ABSTRACT

A resist underlayer film-forming composition including a novolac resin having a structural group (C) formed by reaction between an aromatic ring of an aromatic compound (A) having at least two amino groups and three $C_{6-40}$ aromatic rings and a vinyl group of an aromatic vinyl compound (B). The structural group (C) may be a group of the following Formula (1):

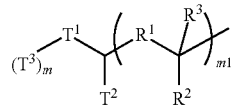

Formula (1)

[wherein $R^1$ is a divalent group containing at least two amino groups and at least three $C_{6-40}$ aromatic rings]. $R^1$ may be a divalent organic group prepared by removal of two hydrogen atoms from aromatic rings of a compound of the following Formula (2):

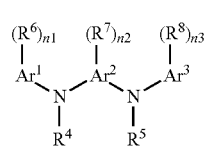

Formula (2)

$R^1$ may be a divalent organic group prepared by removal of two hydrogen atoms from aromatic rings of N,N'-diphenyl-1,4-phenylenediamine.

13 Claims, No Drawings

(56) References Cited

FOREIGN PATENT DOCUMENTS

| WO | 2015/151803 A1 | 10/2015 |
| WO | 2016/072316 A1 | 5/2016 |
| WO | 2017/069063 A1 | 4/2017 |
| WO | 2018/043410 A1 | 3/2018 |

OTHER PUBLICATIONS

Apr. 23, 2019 Written Opinion of the International Searching Authority issued in International Patent Application No. PCT/JP2019/006349.
Jul. 27, 2022 Office Action issued in Taiwanese Patent Application No. 108105671.
Mar. 4, 2024 Office Action issued in Korean Patent Application No. 10-2020-7023398.

US 12,025,916 B2

RESIST UNDERLAYER FILM-FORMING COMPOSITION THAT CONTAINS TRIARYLDIAMINE-CONTAINING NOVOLAC RESIN TO WHICH AROMATIC VINYL COMPOUND IS ADDED

TECHNICAL FIELD

The present invention relates to a resist underlayer film-forming composition for forming a planarization film on a stepped substrate, and to a method for producing a laminated substrate that is planarized by using the resist underlayer film-forming composition.

BACKGROUND ART

Fine processing by lithography using a photoresist composition has been conventionally performed in the production of semiconductor devices. The fine processing is a processing method involving formation of a thin film of a photoresist composition on a to-be-processed substrate (e.g., silicon wafer); irradiation of the thin film with active rays (e.g., ultraviolet rays) through a mask pattern having a semiconductor device pattern drawn thereon; development of the irradiated thin film; and etching of the to-be-processed substrate (e.g., silicon wafer) with the resultant photoresist pattern serving as a protective film.

In recent years, active rays having a shorter wavelength have tended to be used (i.e., shifting from KrF excimer laser (248 nm) to ArF excimer laser (193 nm)) in association with an increase in the degree of integration of semiconductor devices. This tendency causes a serious problem in terms of the influence of diffused reflection of active rays from a substrate or the influence of standing wave. This has led to wide use of a method involving formation of an anti-reflective coating between a photoresist and a to-be-processed substrate.

A lithographic technique using extreme ultraviolet rays (EUV, 13.5 nm) or electron beams (EB) as active rays has been developed for the purpose of finer processing. In general, EUV lithography or EB lithography does not require a specific anti-reflective coating because of no occurrence of standing wave or diffused reflection from a substrate in such a technique. Meanwhile, a resist underlayer film has been widely used as an auxiliary film for improving the resolution or adhesion of a resist pattern.

However, the depth of focus decreases in association with the use of exposure light having a shorter wavelength, and thus the planarity of a coating film formed on a substrate must be improved for forming a desired resist pattern at high accuracy. Thus, the production of a semiconductor device having a fine design rule requires a resist underlayer film that enables formation of a flat (e.g., even) coating film on a substrate.

For example, there has been disclosed a resist underlayer film-forming composition containing a crosslinkable compound having a $C_{2-10}$ alkoxymethyl group or a $C_{1-10}$ alkyl group (see Patent Document 1). According to the patent document, the composition exhibits good fillability when applied to a substrate having a hole pattern.

There has also been disclosed a resist underlayer film-forming composition containing a novolac resin composed of phenylnaphthylamine (see Patent Document 2).

There has also been disclosed a resist underlayer film-forming composition containing a polymer prepared by reaction between a novolac resin composed of phenylnaphthylamine and t-butoxystyrene (see Patent Document 3).

PRIOR ART DOCUMENTS

Patent Documents

Patent Document 1: International Publication WO 2014/208542
Patent Document 2: International Publication WO 2013/047516
Patent Document 3: International Publication WO 2015/151803

SUMMARY OF THE INVENTION

Problems to be Solved by the Invention

In a resist underlayer film-forming composition, a self-crosslinkable moiety is introduced to a polymer resin serving as a main component, or, for example, a crosslinking agent or a crosslinking catalyst is appropriately incorporated, so as to prevent mixing during application of a photoresist composition or formation of a different resist underlayer film. The resist underlayer film-forming composition is baked at high temperature to thermally cure a coating film, whereby the resist underlayer film can be formed without causing mixing of the components of the film with those of the photoresist composition or the different resist underlayer film.

However, since such a thermosetting resist underlayer film-forming composition contains a polymer having a thermally crosslinkable functional group (e.g., a hydroxyl group), a crosslinking agent, and an acid catalyst (acid generator), the viscosity of the composition may increase as crosslinking reaction proceeds by baking during filling of a pattern (e.g., a hole or a trench structure) formed on a substrate with the composition, leading to insufficient filling of the pattern with the composition, resulting in poor planarity after formation of the film.

In some cases, a silicon hard mask layer is formed on the resist underlayer film by vapor deposition. Thus, the resist underlayer film is required to have thermal resistance to cope with heat during vapor deposition. The resist underlayer film is also required to have etching resistance, since a substrate below the film is processed with a pattern transferred onto the film.

An object of the present invention is to improve the filling of a pattern with a composition during baking by improving the thermal reflow property of a polymer contained in the composition. Specifically, an object of the present invention is to provide a resist underlayer film-forming composition containing a polymer having an introduced substituent (e.g., an alkyl group) capable of decreasing the glass transition temperature of the polymer for improving the thermal reflow property of the polymer, so that the composition exhibits a sufficiently low viscosity before initiation of a crosslinking reaction during baking, and forms a coating film of high planarity on a substrate.

Another object of the present invention is to provide a resist underlayer film-forming composition for forming a resist underlayer film having thermal resistance and etching resistance.

Means for Solving the Problems

The present inventors have conducted extensive studies for solving the aforementioned problems, and as a result have found that a resist underlayer film-forming composition containing a novolac resin having a structural group (C) formed by reaction between a vinyl group of an aromatic vinyl compound (B) and an aromatic ring of an aromatic compound (A), which is a novolac resin prepared by reaction of a compound having at least two amino groups and at least three $C_{6\text{-}40}$ aromatic rings with an aldehyde or a ketone, can exhibit improved filling into a pattern formed on a substrate, and thus can form a superior planarization film. The present inventors have also found that the resist underlayer film-forming composition can form a resist underlayer film having planarity and thermal resistance by introducing an alkyl group or an additional substituent into the novolac resin contained in the composition.

Accordingly, a first aspect of the present invention is a resist underlayer film-forming composition comprising a novolac resin having a structural group (C) formed by reaction between an aromatic ring of an aromatic compound (A) having at least two amino groups and three $C_{6\text{-}40}$ aromatic rings and a vinyl group of an aromatic vinyl compound (B).

A second aspect of the present invention is the resist underlayer film-forming composition according to the first aspect, wherein the structural group (C) is a group of the following Formula (1):

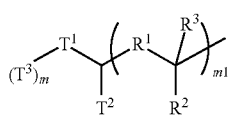

Formula (1)

[wherein
$R^1$ is a divalent group containing at least two amino groups and at least three $C_{6\text{-}40}$ aromatic rings;
$R^2$ and $R^3$ are each independently a hydrogen atom, a $C_{1\text{-}10}$ alkyl group, a $C_{6\text{-}40}$ aryl group, a heterocyclic group, or any combination of these; the alkyl group, the aryl group, and the heterocyclic group are each an organic group optionally substituted with a halogen atom, a nitro group, an amino group, a $C_{1\text{-}10}$ alkyl group, a $C_{6\text{-}40}$ aryl group, a formyl group, a carboxyl group, an alkoxy group, or a hydroxy group; and $R^2$ and $R^3$ optionally form a ring together with the carbon atom to which they are bonded;
$T^1$ is a $C_{6\text{-}40}$ arylene group;
$T^3$ is a $C_{1\text{-}10}$ alkyl group, a $C_{2\text{-}10}$ alkenyl group, a $C_{2\text{-}10}$ alkynyl group, a $C_{6\text{-}40}$ aryl group, a hydroxy group, a cyano group, a nitro group, an amino group, a carboxyl group, an acetyl group, a hydroxymethyl group, a halogenomethyl group, a —Y—Z group, a halogen atom, or any combination of these; Y is an oxygen atom, a sulfur atom, a carbonyl group, or an ester group; and Z is a $C_{1\text{-}10}$ alkyl group;
$T^2$ is a hydrogen atom, a methyl group, or a phenyl group;
m is an integer of 0 to (5+2n);
n is the degree of condensation of an aromatic ring forming the arylene group defined by $T^1$; and
m1 is an integer of 2 to 3,600].

A third aspect of the present invention is the resist underlayer film-forming composition according to the second aspect, wherein $R^1$ is a divalent organic group prepared by removal of two hydrogen atoms from aromatic rings of a compound of the following Formula (2):

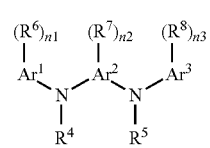

Formula (2)

[wherein
$Ar^1$, $Ar^2$, and $Ar^3$ are each independently a benzene ring or a naphthalene ring;
$R^6$, $R^7$, and $R^8$ are each independently a substituent on the corresponding ring and selected from the group consisting of a halogen atom, a nitro group, an amino group, a hydroxy group, a $C_{1\text{-}10}$ alkyl group, a $C_{2\text{-}10}$ alkenyl group, a $C_{6\text{-}40}$ aryl group, and any combination of these; and the alkyl group, the alkenyl group, and the aryl group are each an organic group optionally containing an ether bond, a ketone bond, or an ester bond;
$R^4$ and $R^5$ are each independently selected from the group consisting of a hydrogen atom, a $C_{1\text{-}10}$ alkyl group, a $C_{2\text{-}10}$ alkenyl group, a $C_{6\text{-}40}$ aryl group, and any combination of these; and the alkyl group, the alkenyl group, and the aryl group are each an organic group optionally containing an ether bond, a ketone bond, or an ester bond; and
n1, n2, and n3 are an integer of 0 to the number of maximum substitutions of $R^6$, $R^7$, and $R^8$, respectively].

A fourth aspect of the present invention is the resist underlayer film-forming composition according to the second aspect, wherein $R^1$ is a divalent organic group prepared by removal of two hydrogen atoms from aromatic rings of N,N'-diphenyl-1,4-phenylenediamine.

A fifth aspect of the present invention is the resist underlayer film-forming composition according to any one of the second to fourth aspects, wherein $R^3$ is a hydrogen atom; and
$R^2$ is an aryl group selected from a phenyl group, a naphthyl group, an anthryl group, and a pyrenyl group, and the aryl group is optionally substituted with a halogen atom, a nitro group, an amino group, a $C_{1\text{-}10}$ alkyl group, a $C_{1\text{-}10}$ alkoxy group, a $C_{6\text{-}40}$ aryl group, a formyl group, a carboxyl group, or a hydroxy group.

A sixth aspect of the present invention is the resist underlayer film-forming composition according to any one of the second to fourth aspects, wherein $R^3$ is a hydrogen atom; and
$R^2$ is a phenyl group, and the phenyl group is optionally substituted with a halogen atom, a nitro group, an amino group, a $C_{1\text{-}10}$ alkyl group, a $C_{1\text{-}10}$ alkoxy group, a $C_{6\text{-}40}$ aryl group, a formyl group, a carboxyl group, or a hydroxy group.

A seventh aspect of the present invention is the resist underlayer film-forming composition according to any one of the second to sixth aspects, wherein $T^1$ is a phenylene group.

An eighth aspect of the present invention is the resist underlayer film-forming composition according to the second aspect, wherein the structural group (C) is a group of the following Formula (1-1):

Formula (1-1)

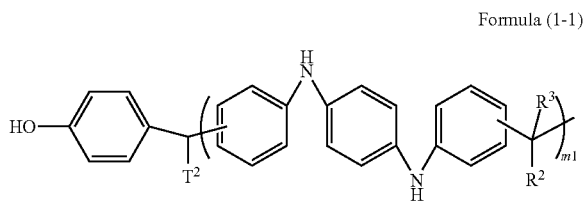

[wherein
$R^2$ and $R^3$ are each independently a hydrogen atom, a $C_{1-10}$ alkyl group, a $C_{6-40}$ aryl group, a heterocyclic group, or any combination of these; the alkyl group, the aryl group, and the heterocyclic group are each an organic group optionally substituted with a halogen atom, a nitro group, an amino group, a $C_{1-10}$ alkyl group, a $C_{6-40}$ aryl group, a formyl group, a carboxyl group, an alkoxy group, or a hydroxy group; and $R^2$ and $R^3$ optionally form a ring together with the carbon atom to which they are bonded;
$T^2$ is a hydrogen atom, a methyl group, or a phenyl group; and
m1 is an integer of 2 to 3,600].

A ninth aspect of the present invention is the resist underlayer film-forming composition according to any one of the first to eighth aspects, wherein the composition further comprises a crosslinking agent.

A tenth aspect of the present invention is the resist underlayer film-forming composition according to any one of the first to ninth aspects, wherein the composition further comprises an acid and/or an acid generator.

An eleventh aspect of the present invention is a resist underlayer film formed by applying the resist underlayer film-forming composition according to any one of the first to tenth aspects onto a semiconductor substrate, and then baking the composition.

A twelfth aspect of the present invention is a method for producing a semiconductor device, the method comprising a step of forming, on a semiconductor substrate, a resist underlayer film from the resist underlayer film-forming composition according to any one of the first to tenth aspects; a step of forming a resist film on the resist underlayer film; a step of irradiating the resist film with light or electron beams, and then developing the resist film, to thereby form a resist pattern; a step of etching the resist underlayer film with the formed resist pattern; and a step of processing the semiconductor substrate with the patterned resist underlayer film.

A thirteenth aspect of the present invention is a method for producing a semiconductor device, the method comprising a step of forming, on a semiconductor substrate, a resist underlayer film from the resist underlayer film-forming composition according to any one of the first to tenth aspects; a step of forming a hard mask on the resist underlayer film; a step of forming a resist film on the hard mask; a step of irradiating the resist film with light or electron beams, and then developing the resist film, to thereby form a resist pattern; a step of etching the hard mask with the formed resist pattern; a step of etching the resist underlayer film with the patterned hard mask; and a step of processing the semiconductor substrate with the patterned resist underlayer film.

Effects of the Invention

In the resist underlayer film-forming composition of the present invention, thermal reflow property during baking is improved by, for example, introducing an alkyl group, which generally decreases the glass transition temperature (Tg) of a polymer, into the skeleton of the main resin contained in the resist underlayer film-forming composition. Thus, when the resist underlayer film-forming composition of the present invention is applied onto a substrate and then baked, a pattern formed on the substrate can be sufficiently filled with the composition because of the improved thermal reflow property of the polymer.

In addition, the resist underlayer film-forming composition of the present invention can form a flat film on a substrate regardless of an open area (non-patterned area) or a patterned area of DENSE (dense) and ISO (coarse) on the substrate. Thus, filling of the pattern with the resist underlayer film-forming composition of the present invention and planarization after filling of the pattern with the composition are achieved, whereby a superior planarization film can be formed.

The novolac resin contained in the resist underlayer film-forming composition of the present invention can exhibit crosslinkability during heating through introduction of a crosslinkable functional group to the end of the resin. Thus, a resist underlayer film formed from the resist underlayer film-forming composition of the present invention can be prevented from intermixing with the layer above the film.

In particular, the present invention can provide a resist underlayer film-forming composition that can form a resist underlayer film exhibiting a good balance between thermal resistance, planarization, and etching resistance.

MODES FOR CARRYING OUT THE INVENTION

The present invention is directed to a resist underlayer film-forming composition comprising a novolac resin having a structural group (C) formed by reaction between an aromatic ring of an aromatic compound (A) having at least two amino groups and three $C_{6-40}$ aromatic rings and a vinyl group of an aromatic vinyl compound (B).

In the present invention, the resist underlayer film-forming composition contains the aforementioned novolac resin. The resist underlayer film-forming composition may optionally contain, for example, a solvent, a crosslinking agent, an acid, an acid generator, or a surfactant.

The resist underlayer film-forming composition of the present invention has a solid content of 0.1 to 70% by mass, or 0.1 to 60% by mass. The "solid content" as used herein corresponds to the total amount of all components of the resist underlayer film-forming composition, except for the amount of the solvent. The amount of the aforementioned novolac resin in the solid content may be 1 to 100% by mass, or 1 to 99.9% by mass, or 50 to 99.9% by mass, or 50 to 95% by mass, or 50 to 90% by mass.

The novolac resin used in the present invention has a weight average molecular weight of 600 to 1,000,000 or 600 to 200,000.

The novolac resin used in the present invention has, at an end thereof, the structural group (C), preferably a structural group of Formula (1).

The novolac resin has the structural group (C) of Formula (1); i.e., the structural group (C) formed by reaction between a vinyl group of the aromatic vinyl compound (B) and an aromatic ring of the aromatic compound (A), which is a novolac resin prepared by reaction of an organic compound having at least two amino groups and at least three $C_{6-40}$ aromatic rings with an aldehyde or a ketone.

In Formula (1), $R^1$ is a divalent group containing at least two amino groups and at least three $C_{6-40}$ aromatic rings;

$R^2$ and $R^3$ are each independently a hydrogen atom, a $C_{1-10}$ alkyl group, a $C_{6-40}$ aryl group, a heterocyclic group, or any combination of these; the alkyl group, the aryl group, and the heterocyclic group are each an organic group optionally substituted with a halogen atom, a nitro group, an amino group, a $C_{1-10}$ alkyl group, a $C_{6-40}$ aryl group, a formyl group, a carboxyl group, an alkoxy group, or a hydroxy group; and $R^2$ and $R^3$ optionally form a ring together with the carbon atom to which they are bonded;

$T^1$ is a $C_{6-40}$ arylene group;

$T^3$ is a $C_{1-10}$ alkyl group, a $C_{2-10}$ alkenyl group, a $C_{2-10}$ alkynyl group, a $C_{6-40}$ aryl group, a hydroxy group, a cyano group, a nitro group, an amino group, a carboxyl group, an acetyl group, a hydroxymethyl group, a halogenomethyl group, a —Y—Z group, a halogen atom, or any combination of these; Y is an oxygen atom, a sulfur atom, a carbonyl group, or an ester group; and Z is a $C_{1-10}$ alkyl group;

$T^2$ is a hydrogen atom, a methyl group, or a phenyl group;

m is an integer of 0 to (5+2n);

n is the degree of condensation of an aromatic ring forming the arylene group defined by $T^1$;

$T^2$ is preferably a methyl group; and m1 is an integer of 2 to 3,600, or an integer of 2 to 3,000, or an integer of 2 to 2,000, or an integer of 2 to 735, or an integer of 3 to 3,600, or an integer of 3 to 3,000, or an integer of 3 to 2,000, or an integer of 3 to 735, or an integer of 5 to 3,600, or an integer of 5 to 3,000, or an integer of 5 to 2,000, or an integer of 5 to 735.

Examples of the aforementioned amino group include primary amino group, secondary amino group, and tertiary amino group.

Examples of the aforementioned aromatic ring include benzene ring, naphthalene ring, anthracene ring, and pyrene ring.

$R^1$ in Formula (1) is a divalent group containing at least two amino groups and at least three $C_{6-40}$ aromatic rings and forms the main chain of the novolac resin. $R^1$ may be a divalent group containing any of the aforementioned amino groups and any of the aforementioned aromatic rings. In particular, $R^1$ is preferably a divalent group containing two amino groups and three $C_{6-40}$ aromatic rings.

$R^1$ in Formula (1) may be a divalent organic group prepared by removal of two hydrogen atoms from aromatic rings of a compound of Formula (2). Aromatic rings in the compound of Formula (2) form the novolac resin together with an aldehyde or a ketone.

Since a divalent organic group is derived from the compound of Formula (2), any two aromatic rings in Formula (2) are bonded to an aldehyde or a ketone to form the novolac resin. For example, $Ar^1$ and $Ar^3$, $Ar^1$ and $Ar^2$, $Ar^1$ and $Ar^1$, $Ar^2$ and $Ar^2$, any two of the aryl groups of $R^4$ to $R^8$, or any of $Ar^1$ to $Ar^3$ and any of the aryl groups of $R^4$ to $R^8$ may be bonded to an aldehyde or a ketone. When the compound has an aromatic ring as a substituent, the aromatic ring may be bonded to an aldehyde or a ketone.

In Formula (2), $Ar^1$, $Ar^2$, and $Ar^3$ are each independently a benzene ring or a naphthalene ring;

$R^6$, $R^7$, and $R^8$ are each independently a substituent on the corresponding ring and selected from the group consisting of a halogen atom, a nitro group, an amino group, a hydroxy group, a $C_{1-10}$ alkyl group, a $C_{2-10}$ alkenyl group, a $C_{6-40}$ aryl group, and any combination of these; and the alkyl group, the alkenyl group, and the aryl group are each an organic group optionally containing an ether bond, a ketone bond, or an ester bond;

$R^4$ and $R^5$ are each independently selected from the group consisting of a hydrogen atom, a $C_{1-10}$ alkyl group, a $C_{2-10}$ alkenyl group, a $C_{6-40}$ aryl group, and any combination of these; and the alkyl group, the alkenyl group, and the aryl group are each an organic group optionally containing an ether bond, a ketone bond, or an ester bond; and n1, n2, and n3 are an integer of 0 to the number of maximum substitutions of $R^6$, $R^7$, and $R^8$, respectively. Generally, n1, n2, and n3 are each an integer of 0 to 4, or 0 to 3, or 0 to 2, or 0 to 1.

The aromatic vinyl compound (B) may be, for example, a compound having a vinyl group having a structure of the following Formula (B-1):

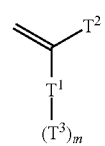

Formula (B-1)

In Formula (B-1), $T^1$ is a $C_{6-40}$ arylene group;

$T^3$ is a $C_{1-10}$ alkyl group, a $C_{2-10}$ alkenyl group, a $C_{2-10}$ alkynyl group, a $C_{6-40}$ aryl group, a hydroxy group, a cyano group, a nitro group, an amino group, a carboxyl group, an acetyl group, a hydroxymethyl group, a halogenomethyl group, a —Y—Z group, a halogen atom, or any combination of these; Y is an oxygen atom, a sulfur atom, a carbonyl group, or an ester group; and Z is a $C_{1-10}$ alkyl group;

$T^2$ is a hydrogen atom, a methyl group, or a phenyl group, and is preferably a hydrogen atom;

m is an integer of 0 to (5+2n); and n is the degree of condensation of an aromatic ring forming the arylene group defined by $T^1$.

Examples of the aforementioned halogen atom include fluorine atom, chlorine atom, bromine atom, and iodine atom.

Examples of the $C_{1-10}$ alkyl group include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethylcyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

Examples of the $C_{2-10}$ alkenyl group include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

Examples of the aforementioned $C_{2-10}$ alkynyl group include ethynyl group and propargyl group.

Examples of the aforementioned $C_{1-20}$ or $C_{1-10}$ alkoxy group include methoxy group, ethoxy group, n-propoxy group, i-propoxy group, n-butoxy group, i-butoxy group, s-butoxy group, t-butoxy group, n-pentoxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group.

Examples of the aforementioned $C_{6-40}$ aryl group include phenyl group, o-methylphenyl group, m-methylphenyl group, p-methylphenyl group, o-chlorophenyl group, m-chlorophenyl group, p-chlorophenyl group, o-fluorophenyl group, p-fluorophenyl group, o-methoxyphenyl group, p-methoxyphenyl group, p-nitrophenyl group, p-cyanophenyl group, α-naphthyl group, β-naphthyl group, o-biphenyl group, m-biphenyl group, p-biphenyl group, 1-anthryl group, 2-anthryl group, 9-anthryl group, 1-phenanthryl group, 2-phenanthryl group, 3-phenanthryl group, 4-phenanthryl group, 9-phenanthryl group, and pyrenyl group.

The aforementioned heterocyclic group is preferably an organic group composed of a 5- or 6-membered heterocyclic ring containing a nitrogen atom, a sulfur atom, or an oxygen atom. Examples of the heterocyclic group include pyrrole group, furan group, thiophene group, imidazole group, oxazole group, thiazole group, pyrazole group, isoxazole group, isothiazole group, and pyridine group.

Of these, a heterocyclic group containing a sulfur atom is preferred for use in a material of high refractive index.

Examples of the aforementioned $C_{6-40}$ arylene group include phenylene group, o-methylphenylene group, m-methylphenylene group, p-methylphenylene group, o-chlorophenylene group, m-chlorophenylene group, p-chlorophenylene group, o-fluorophenylene group, p-fluorophenylene group, o-methoxyphenylene group, p-methoxyphenylene group, p-nitrophenylene group, p-cyanophenylene group, α-naphthylene group, β-naphthylene group, o-biphenylylene group, m-biphenylylene group, p-biphenylylene group, 1-anthrylene group, 2-anthrylene group, 9-anthrylene group, 1-phenanthrylene group, 2-phenanthrylene group, 3-phenanthrylene group, 4-phenanthrylene group, and 9-phenanthrylene group.

In Formula (1), $R^3$ is a hydrogen atom; $R^2$ is an aryl group selected from a phenyl group, a naphthyl group, an anthryl group, and a pyrenyl group; and the aryl group may be substituted with a halogen atom, a nitro group, an amino group, a $C_{1-10}$ alkyl group, a $C_{1-10}$ alkoxy group, a $C_{6-40}$ aryl group, a formyl group, a carboxyl group, or a hydroxy group.

Alternatively, $R^3$ is a hydrogen atom; $R^2$ is a phenyl group; and the phenyl group may be substituted with a halogen atom, a nitro group, an amino group, a $C_{1-10}$ alkyl group, a $C_{1-10}$ alkoxy group, a $C_{6-40}$ aryl group, a formyl group, a carboxyl group, or a hydroxy group.

Examples of the aldehyde used for the production of the novolac resin in the present invention include saturated aliphatic aldehydes, such as formaldehyde, paraformaldehyde, acetaldehyde, propylaldehyde, butyraldehyde, isobutyraldehyde, valeraldehyde, capronaldehyde, 2-methylbutylaldehyde, hexylaldehyde, undecanaldehyde, 7-methoxy-3,7-dimethyloctylaldehyde, cyclohexanaldehyde, 3-methyl-2- butyraldehyde, glyoxal, malonaldehyde, succinaldehyde, glutaraldehyde, glutaraldehyde, and adipaldehyde; unsaturated aliphatic aldehydes, such as acrolein and methacrolein; heterocyclic aldehydes, such as furfural, pyridinaldehyde, and thiophenaldehyde; and aromatic aldehydes, such as benzaldehyde, naphthaldehyde, anthracenecarboxaldehyde, phenylbenzaldehyde, anisaldehyde, ethoxybenzaldehyde, n-pentyloxybenzaldehyde, n-octyloxybenzaldehyde, trimethoxybenzaldehyde, ethylbenzaldehyde, n-butylbenzaldehyde, t-butylbenzaldehyde, isopropylbenzaldehyde, isobutylbenzaldehyde, terephthalaldehyde, pyrenecarboxyaldehyde, phenanthrylaldehyde, salicylaldehyde, phenylacetaldehyde, 3-phenylpropionaldehyde, tolylaldehyde, (N,N-dimethylamino)benzaldehyde, and acetoxybenzaldehyde. In particular, aromatic aldehydes are preferably used.

Examples of the ketone used for the production of the novolac resin in the present invention include diaryl ketones, such as diphenyl ketone, phenyl naphthyl ketone, dinaphthyl ketone, phenyl tolyl ketone, ditolyl ketone, and 9-fluorenone.

The novolac reaction (condensation reaction) of an organic compound having at least two amino groups and at least three $C_{6\text{-}40}$ aryl groups (preferably an aromatic compound of Formula (2)) with an aldehyde or a ketone is preferably performed so that the aromatic compound is reacted with the aldehyde or the ketone at a ratio by mole of 1:0.1 to 10, 1:0.5 to 2.0, or 1:1.

The reaction between an aromatic ring of the aromatic compound (A) and a vinyl group of the aromatic vinyl compound (B) is preferably performed so that the compound (A) is reacted with the compound (B) at a ratio by mole of 1:0.1 to 8.0 or 1:0.1 to 4.0.

The aforementioned condensation reaction may be performed simultaneously with the addition reaction with a vinyl group of the aromatic vinyl compound (B). Examples of the acid catalyst used for these reactions include mineral acids, such as sulfuric acid, phosphoric acid, and perchloric acid; organic sulfonic acids, such as p-toluenesulfonic acid, p-toluenesulfonic acid monohydrate, methanesulfonic acid, and trifluoromethanesulfonic acid; and carboxylic acids, such as formic acid and oxalic acid.

The amount of the acid catalyst is appropriately determined depending on the type of the acid used. The amount of the acid catalyst is generally 0.001 to 10,000 parts by mass, preferably 0.01 to 1,000 parts by mass, more preferably 0.1 to 100 parts by mass, relative to 100 parts by mass of the aromatic compound.

Although the aforementioned condensation reaction and addition reaction may be performed without use of a solvent, the reactions are generally performed with use of a solvent. Any solvent can be used, so long as it does not inhibit the reactions. Examples of the usable solvent include ethers, such as 1,2-dimethoxyethane, diethylene glycol dimethyl ether, propylene glycol monomethyl ether, propylene glycol monomethyl ether acetate, butyl cellosolve, tetrahydrofuran, and dioxane. When the acid catalyst used is in the form of liquid (e.g., formic acid), such a liquid acid may also serve as a solvent.

The reaction temperature during condensation is generally 40° C. to 200° C. The reaction time, which is appropriately determined depending on the reaction temperature, is generally about 30 minutes to 50 hours.

The polymer prepared as described above has a weight average molecular weight Mw of generally 500 to 1,000,000 or 600 to 200,000.

Examples of the novolac resin prepared by reaction between the aforementioned aromatic compound and the aforementioned aldehyde or ketone include novolac resins having unit structures described below.

$R^1$ in Formula (1) may be a divalent organic group prepared by removal of two hydrogen atoms from aromatic rings of N,N'-diphenyl-1,4-phenylenediamine. This compound has three benzene rings and may have a benzene ring as a substituent. Similar to the aforementioned case, any two of these benzene rings are bonded to the aldehyde or ketone to form the novolac resin.

The novolac resin of the present invention is a polymer having the structural group (C) added to its end. For example, the novolac resin of the present invention is a polymer having a structural group of any of Formulae (C-1) to (C-22) added to an end of a novolac resin having a unit structure of any of Formulae (3-1) to (3-22) described below.

Typically, the polymer having a structural group of Formula (1) is preferably a polymer having a structural group of Formula (1-1).

When $T^3$ in Formula (1) is an alkoxy group such as a t-butoxy group, the group $T^3$ is converted by hydrolysis into a hydroxy group as shown in Formula (1-1).

Preferably, $T^1$ is a phenylene group, and $T^2$ is a methyl group.

In Formula (1-1), $R^2$ and $R^3$ are each independently a hydrogen atom, a $C_{1\text{-}10}$ alkyl group, a $C_{6\text{-}40}$ aryl group, a heterocyclic group, or any combination of these; the alkyl group, the aryl group, and the heterocyclic group are each an organic group optionally substituted with a halogen atom, a nitro group, an amino group, a $C_{1\text{-}10}$ alkyl group, a $C_{6\text{-}40}$ aryl group, a formyl group, a carboxyl group, an alkoxy group, or a hydroxy group; and $R^2$ and $R^3$ optionally form a ring together with the carbon atom to which they are bonded;

$T^2$ is a hydrogen atom, a methyl group, or a phenyl group; and m1 is an integer of 2 to 3,600, or an integer of 2 to 3,000, or an integer of 2 to 2,000, or an integer of 2 to 735, or an integer of 3 to 3,600, or an integer of 3 to 3,000, or an integer of 3 to 2,000, or an integer of 3 to 735, or an integer of 5 to 3,600, or an integer of 5 to 3,000, or an integer of 5 to 2,000, or an integer of 5 to 735.

For example, $R^2$ is a hydrogen atom, and $R^3$ is a phenyl group substituted with a $C_{1\text{-}10}$ alkoxy group.

The novolac resin used in the present invention may have any unit structure described below.

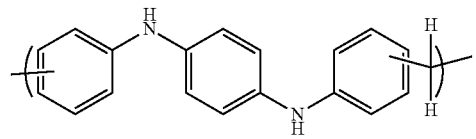

Formula (3-1)

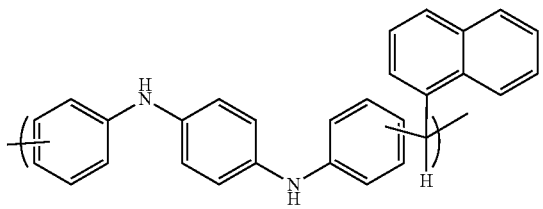

Formula (3-2)

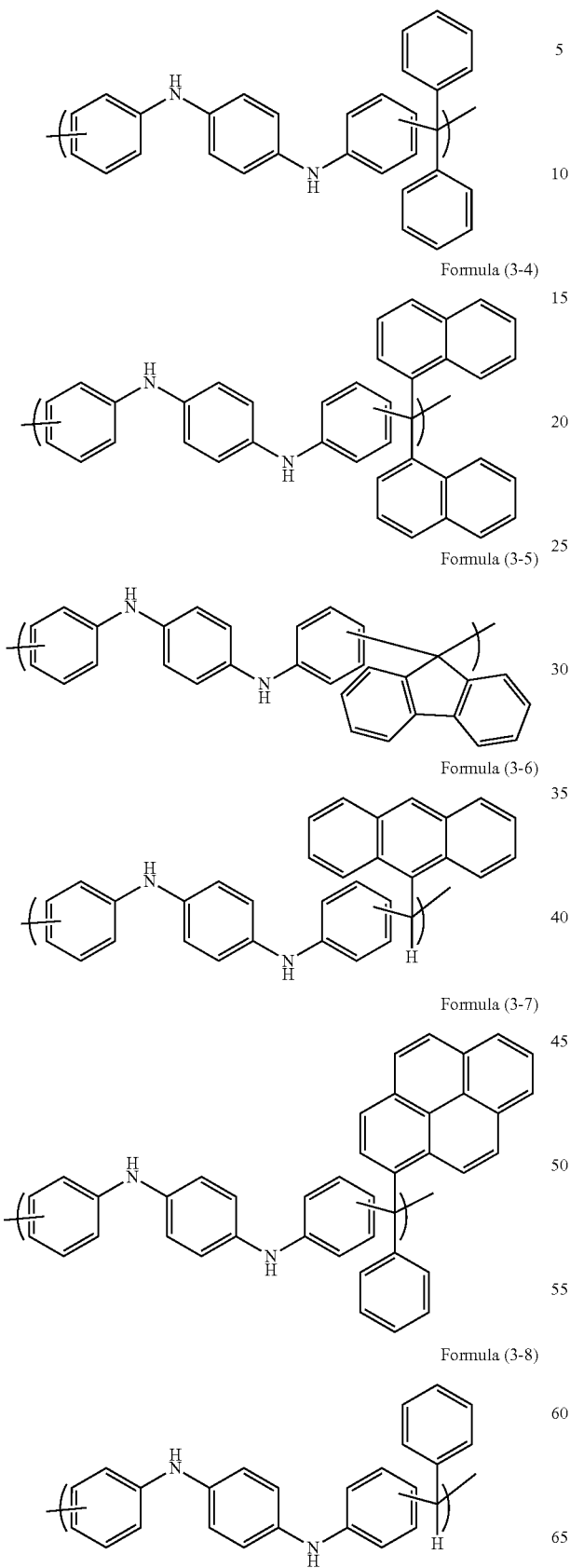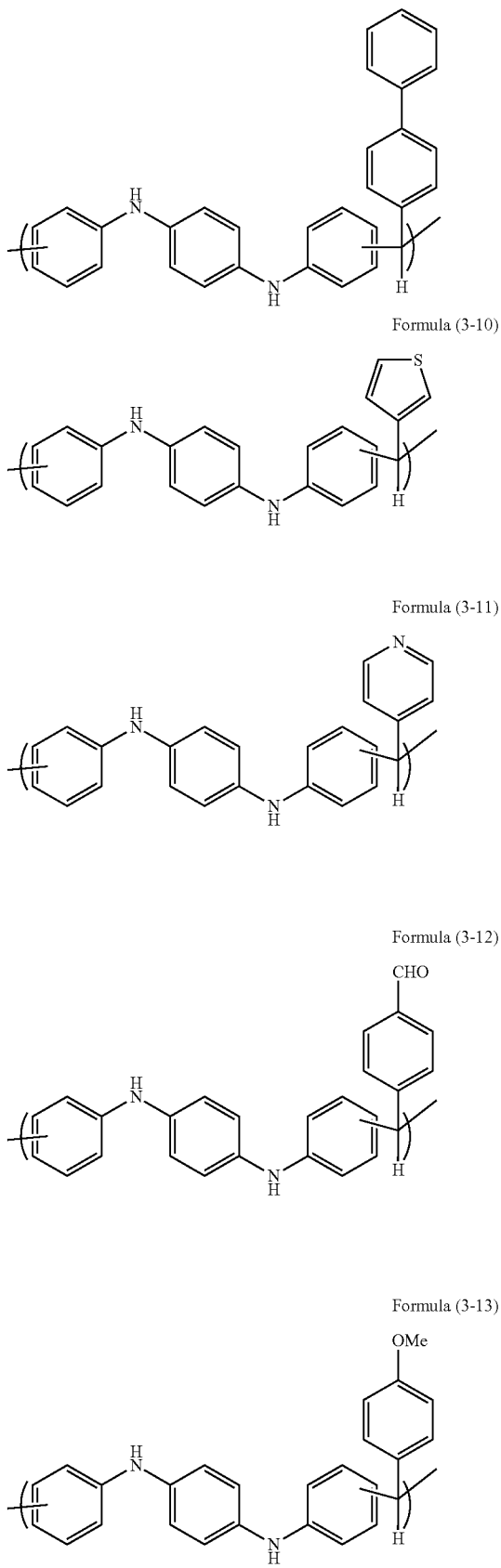

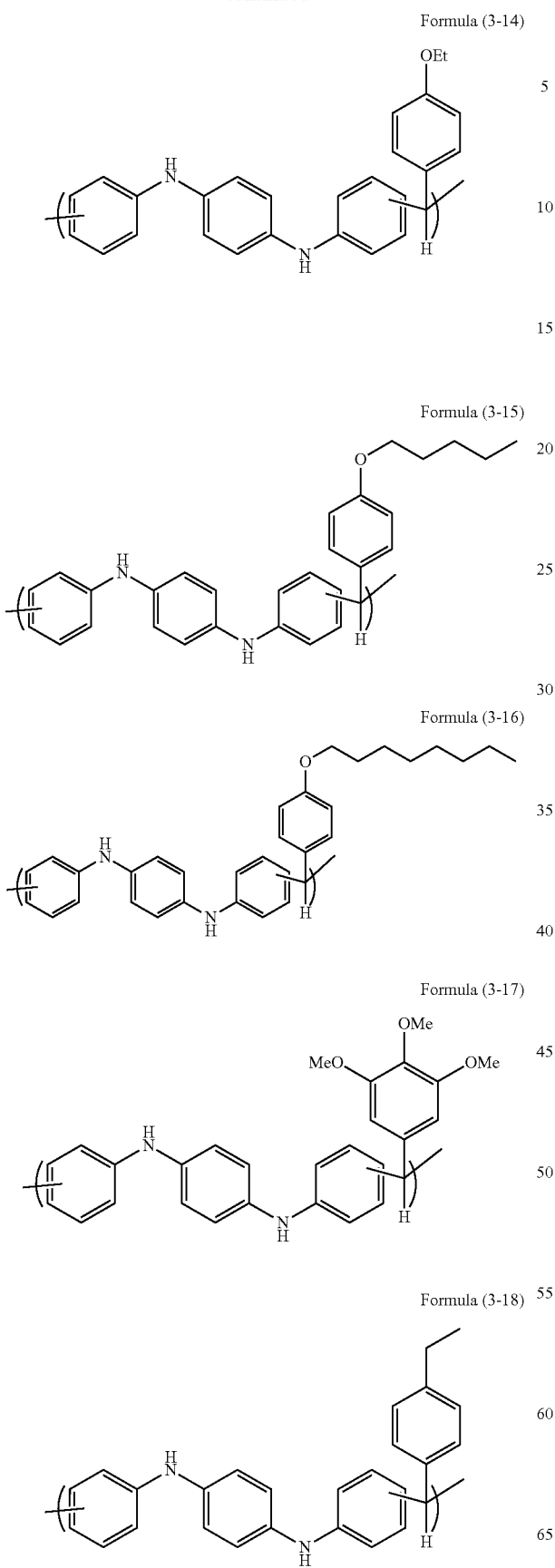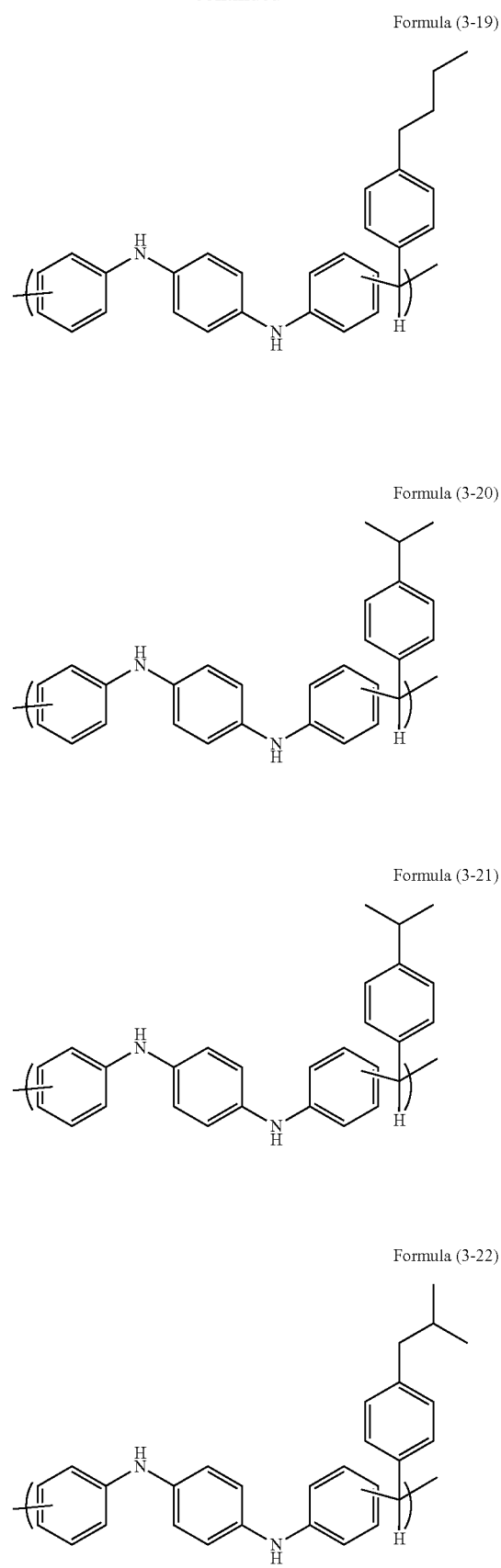

Examples of the structural group (C) present at an end of the aforementioned novolac resin are as follows.
Formula (C-1)
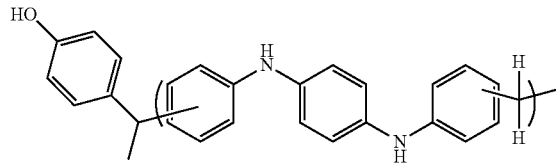
Formula (C-2)
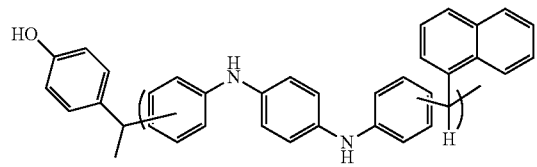
Formula (C-3)
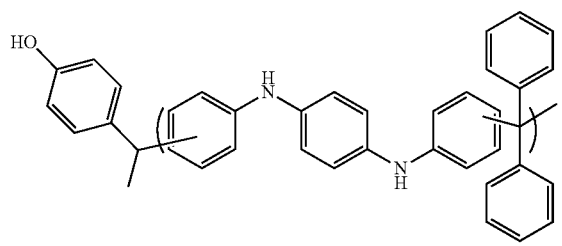
Formula (C-4)
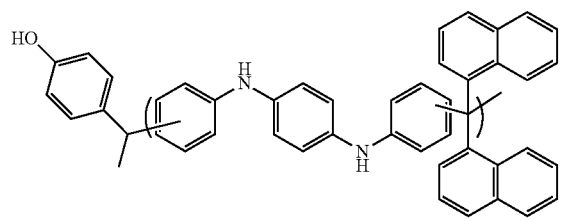
Formula (C-5)
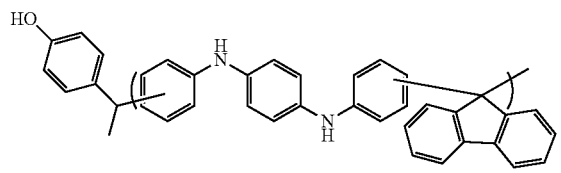
Formula (C-6)
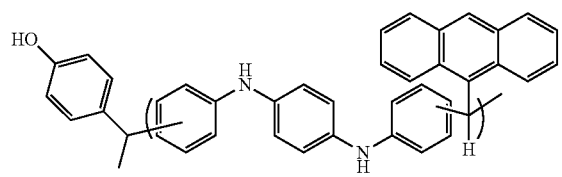
Formula (C-7)
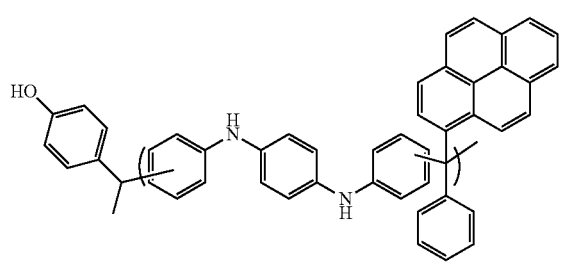
Formula (C-8)
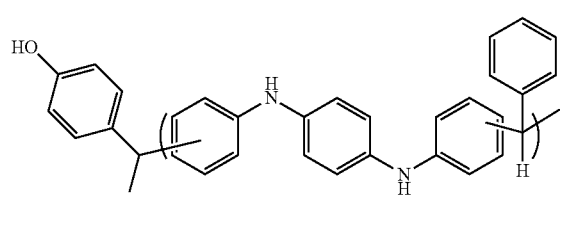
Formula (C-9)
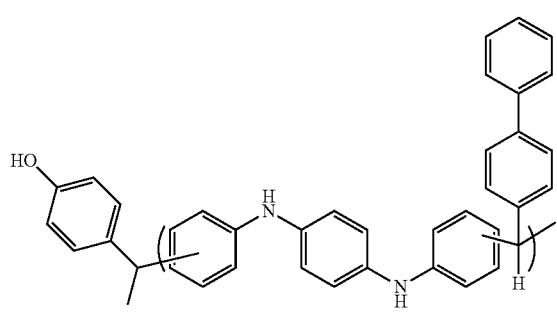
Formula (C-10)
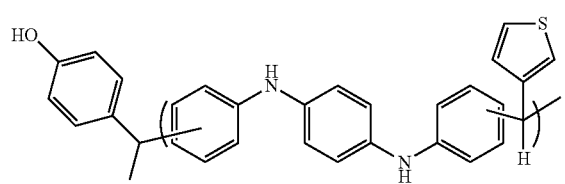
Formula (C-11)
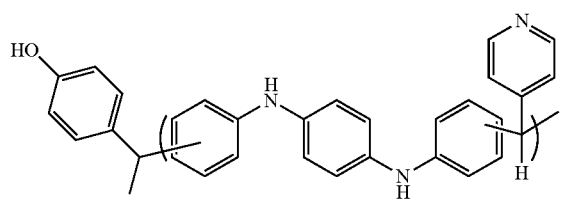
Formula (C-12)
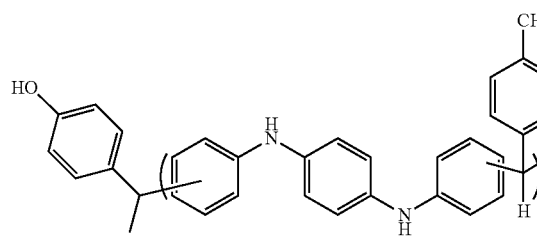

-continued
Formula (C-13)
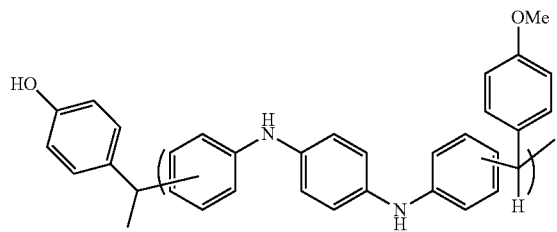
Formula (C-14)
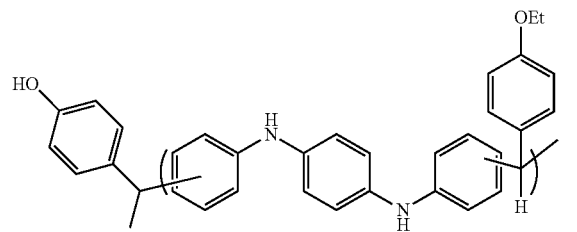
Formula (C-15)
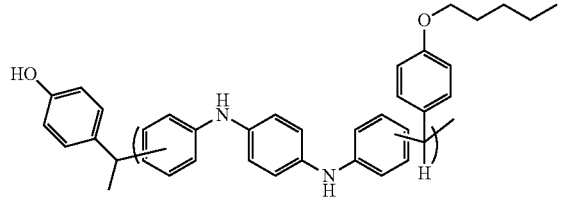
Formula (C-16)
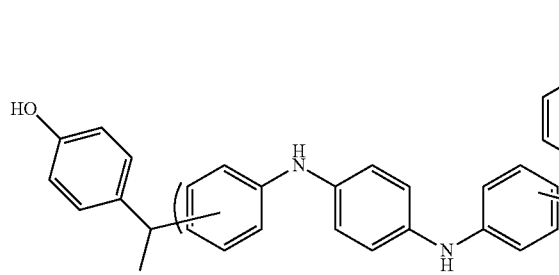
Formula (C-17)
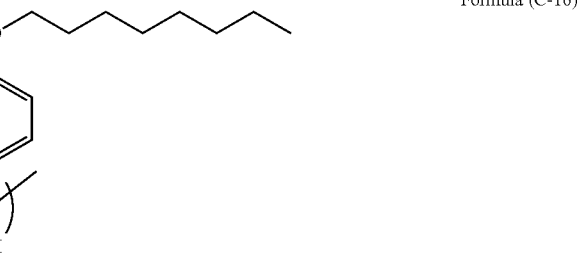
Formula (C-18)
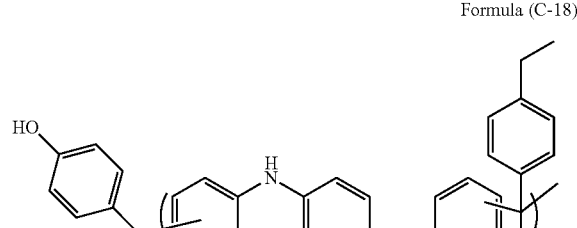
Formula (C-19)
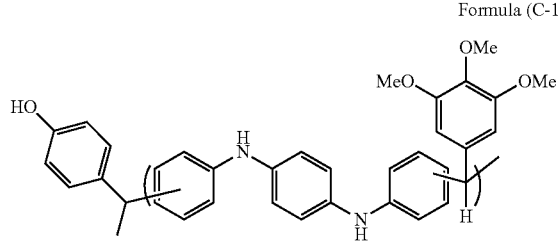
Formula (C-20)
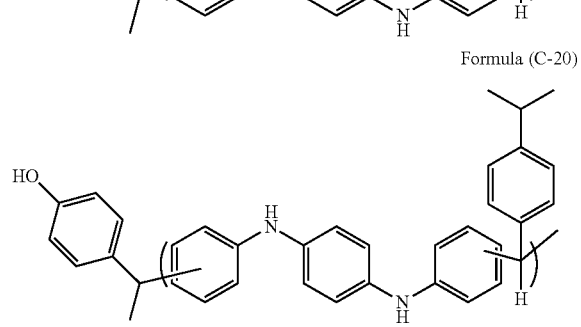
Formula (C-21)
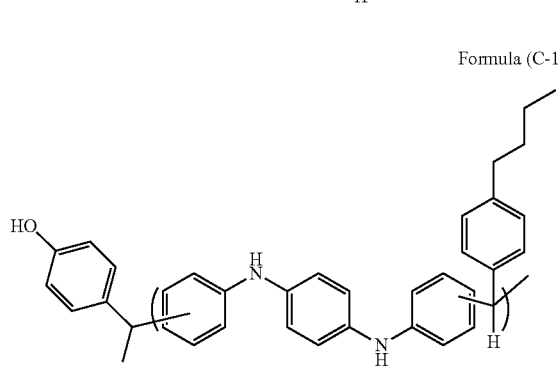
Formula (C-22)
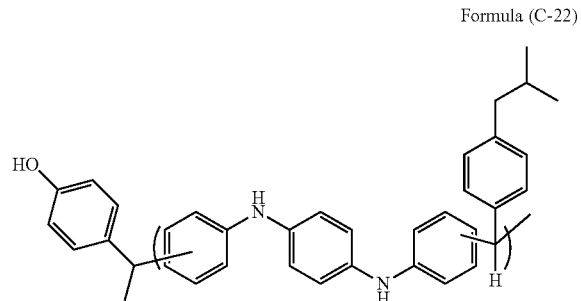
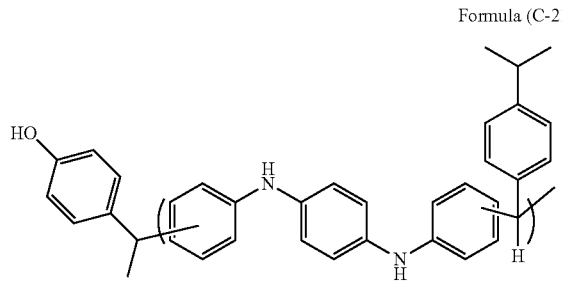

The resist underlayer film-forming composition of the present invention may contain a crosslinking agent component. The crosslinking agent is, for example, a melamine compound, a substituted urea compound, or a polymer thereof. The crosslinking agent is preferably a crosslinking agent having at least two crosslinkable substituents, for example, a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or methoxymethylated thiourea. A condensate of such a compound may also be used.

The aforementioned crosslinking agent may be a crosslinking agent having high thermal resistance. The crosslinking agent having high thermal resistance is preferably a compound containing a crosslinkable substituent having an aromatic ring (e.g., a benzene ring or a naphthalene ring) in the molecule.

Examples of the compound include a compound having a partial structure of the following Formula (4) and a polymer or oligomer having a repeating unit of the following Formula (5).

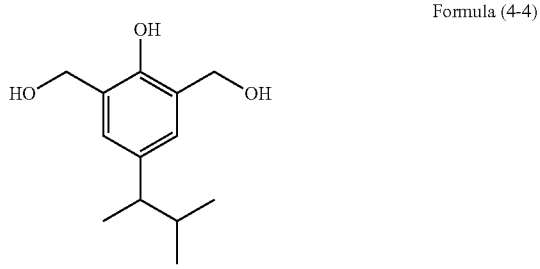

Formula (4)

Formula (5)

In the aforementioned formulae, $R^{15}$, $R^{16}$, $R^{17}$, and $R^{18}$ are each independently a hydrogen atom or a $C_{1-10}$ alkyl group, and these alkyl groups may be those exemplified above.

In the aforementioned formulae, n15 is an integer of 1 or 2, n16 is an integer of 1 to (6−n15), n17 is an integer of 1 or 2, and n18 is an integer of 0 to (4−n17).

Examples of the compound of Formula (4) and the polymer or oligomer of Formula (5) are as follows.

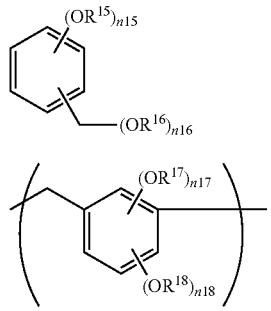

Formula (4-1)

Formula (4-2)

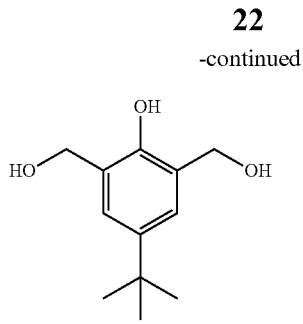

Formula (4-3)

Formula (4-4)

Formula (4-5)

Formula (4-6)

Formula (4-7)

Formula (4-8)

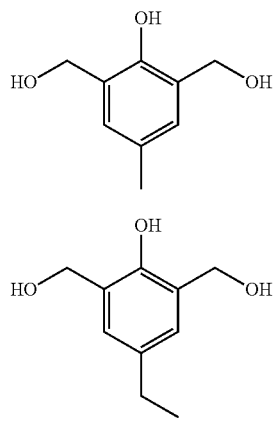

Formula (4-9)
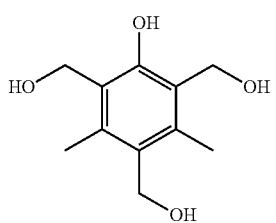
Formula (4-10)
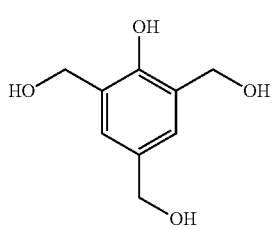
Formula (4-11)
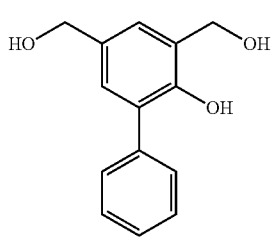
Formula (4-12)
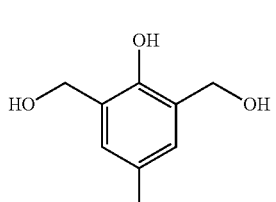
Formula (4-13)
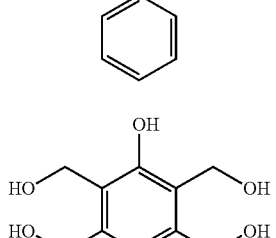
Formula (4-14)
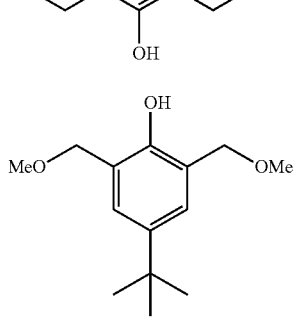
Formula (4-15)
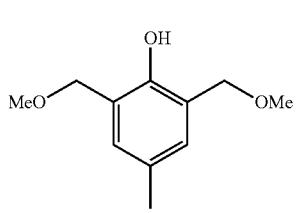
Formula (4-16)
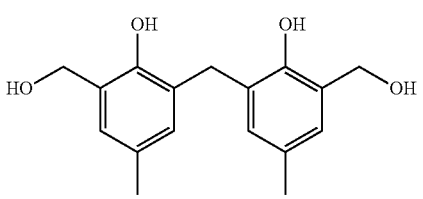
Formula (4-17)
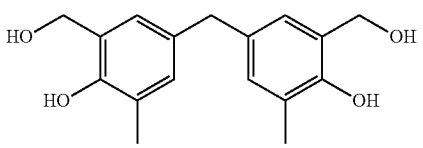
Formula (4-18)
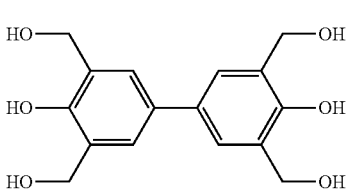
Formula (4-19)
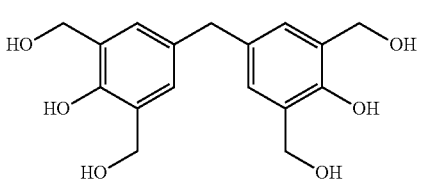
Formula (4-20)
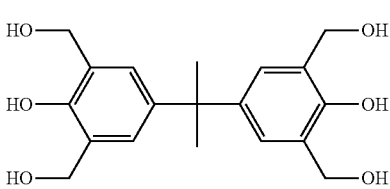
Formula (4-21)
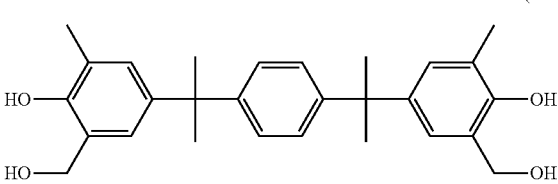
Formula (4-22)
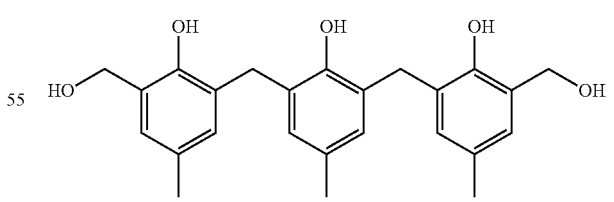
Formula (4-23)
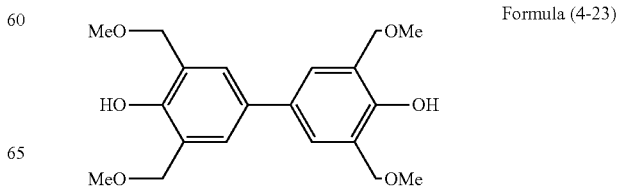

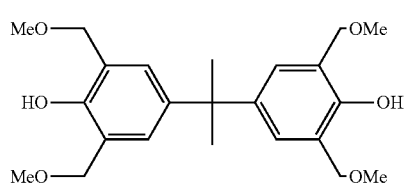

Formula (4-24)

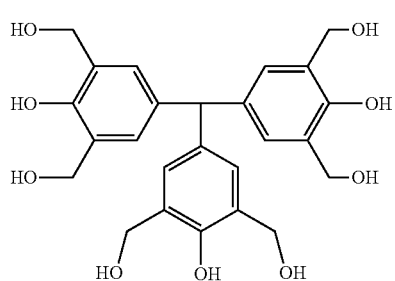

Formula (4-25)

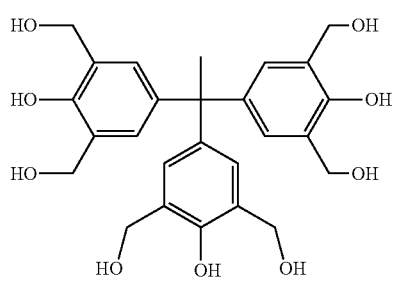

Formula (4-26)

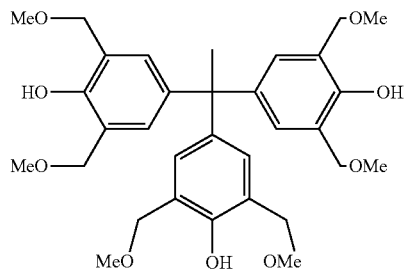

Formula (4-27)

The aforementioned compounds can be obtained as products available from ASAHI YUKIZAI CORPORATION and Honshu Chemical Industry Co., Ltd. For example, among the aforementioned crosslinking agents, the compound of Formula (4-24) can be obtained as trade name TM-BIP-A available from ASAHI YUKIZAI CORPORATION.

The amount of the crosslinking agent added may vary depending on, for example, the type of a coating solvent used, the type of an underlying substrate used, the viscosity of a solution required, or the shape of a film required. The amount of the crosslinking agent is 0.001 to 80% by mass, preferably 0.01 to 50% by mass, more preferably 0.05 to 40% by mass, relative to the total solid content. Such a crosslinking agent may cause a crosslinking reaction by its self-condensation. When a crosslinkable substituent is present in any of the aforementioned polymers of the present invention, such a crosslinking agent may cause a crosslinking reaction with the crosslinkable substituent.

In the present invention, an acid and/or an acid generator may be added as a catalyst for promoting the aforementioned crosslinking reaction. Specifically, the composition may contain an acidic compound such as p-toluenesulfonic acid, trifluoromethanesulfonic acid, pyridinium p-toluenesulfonate, salicylic acid, 5-sulfosalicylic acid, 4-phenolsulfonic acid, pyridinium 4-phenolsulfonate, camphorsulfonic acid, 4-chlorobenzenesulfonic acid, benzenedisulfonic acid, 1-naphthalenesulfonic acid, citric acid, benzoic acid, hydroxybenzoic acid, or naphthalenecarboxylic acid and/or a thermal acid generator such as 2,4,4,6-tetrabromocyclohexadienone, benzoin tosylate, 2-nitrobenzyl tosylate, or another organic sulfonic acid alkyl ester.

The amount of the acid and/or the acid generator is 0.0001 to 20% by mass, preferably 0.0005 to 10% by mass, more preferably 0.01 to 3% by mass, relative to the total solid content.

The resist underlayer film-forming composition for lithography of the present invention may contain a photoacid generator so as to match the acidity of the resist underlayer film with that of a photoresist formed above the film by a lithographic process.

Preferred examples of the photoacid generator include onium salt photoacid generators, such as bis(4-t-butylphenyl)iodonium trifluoromethanesulfonate and triphenylsulfonium trifluoromethanesulfonate; halogen-containing compound photoacid generators, such as phenyl-bis(trichloromethyl)-s-triazine; and sulfonic acid photoacid generators, such as benzoin tosylate and N-hydroxysuccinimide trifluoromethanesulfonate.

The amount of the photoacid generator is 0.2 to 10% by mass, preferably 0.4 to 5% by mass, relative to the total solid content.

The resist underlayer film-forming composition for lithography of the present invention may optionally contain, for example, an additional light-absorbing agent, a rheology controlling agent, an adhesion aid, or a surfactant besides the aforementioned components.

Preferred examples of the additional light-absorbing agent include commercially available light-absorbing agents described in "Kogyoyo Shikiso no Gijutsu to Shijo" (CMC Publishing Co., Ltd.) and "Senryo Binran" (edited by The Society of Synthetic Organic Chemistry, Japan), such as C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; and C. I. Pigment Brown 2.

The light-absorbing agent is incorporated in an amount of generally 10% by mass or less, preferably 5% by mass or less, relative to the total solid content of the resist underlayer film-forming composition for lithography.

The rheology controlling agent is incorporated for the main purpose of improving the fluidity of the resist underlayer film-forming composition; in particular, the purpose of improving the thickness uniformity of a resist underlayer film or improving filling of the interior of a hole with the resist underlayer film-forming composition in a baking process.

Specific examples of the rheology controlling agent include phthalic acid derivatives, such as dimethyl phthalate, diethyl phthalate, diisobutyl phthalate, dihexyl phthalate, and butyl isodecyl phthalate; adipic acid derivatives, such as di-normal butyl adipate, diisobutyl adipate, diisooctyl adipate, and octyldecyl adipate; maleic acid derivatives, such as di-normal butyl maleate, diethyl maleate, and dinonyl maleate; oleic acid derivatives, such as methyl oleate, butyl oleate, and tetrahydrofurfuryl oleate; and stearic acid derivatives, such as normal butyl stearate and glyceryl stearate.

Such a rheology controlling agent is incorporated in an amount of generally less than 30% by mass relative to the total solid content of the resist underlayer film-forming composition for lithography.

The adhesion aid is incorporated for the main purpose of improving adhesion between a substrate or a resist and the resist underlayer film-forming composition; in particular, the purpose of preventing peeling of the resist during development.

Specific examples of the adhesion aid include chlorosilane compounds, such as trimethylchlorosilane, dimethylvinylchlorosilane, methyldiphenylchlorosilane, and chloromethyldimethylchlorosilane; alkoxysilane compounds, such as trimethylmethoxysilane, dimethyldiethoxysilane, methyldimethoxysilane, dimethylvinylethoxysilane, diphenyldimethoxysilane, and phenyltriethoxysilane; silazane compounds, such as hexamethyldisilazane, N,N'-bis(trimethylsilyl)urea, dimethyltrimethylsilylamine, and trimethylsilylimidazole; silane compounds, such as vinyltrichlorosilane, γ-chloropropyltrimethoxysilane, γ-aminopropyltriethoxysilane, and γ-glycidoxypropyltrimethoxysilane; heterocyclic compounds, such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; and urea or thiourea compounds, such as 1,1-dimethylurea and 1,3-dimethylurea.

Such an adhesion aid is incorporated in an amount of generally less than 5% by mass, preferably less than 2% by mass, relative to the total solid content of the resist underlayer film-forming composition for lithography.

The resist underlayer film-forming composition for lithography of the present invention may contain a surfactant for further improving the applicability of the composition to an uneven surface without causing, for example, pinholes or striations.

Examples of the surfactant include nonionic surfactants, for example, polyoxyethylene alkyl ethers, such as polyoxyethylene lauryl ether, polyoxyethylene stearyl ether, polyoxyethylene cetyl ether, and polyoxyethylene oleyl ether, polyoxyethylene alkylallyl ethers, such as polyoxyethylene octylphenol ether and polyoxyethylene nonylphenol ether, polyoxyethylene-polyoxypropylene block copolymers, sorbitan fatty acid esters, such as sorbitan monolaurate, sorbitan monopalmitate, sorbitan monostearate, sorbitan monooleate, sorbitan trioleate, and sorbitan tristearate, polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-containing surfactants, such as EFTOP EF301, EF303, and EF352 (trade name, available from Tohkem Products Corporation), MEGAFAC F171, F173, R-30, and R-30N (trade name, available from Dainippon Ink and Chemicals, Inc.), Fluorad FC430 and FC431 (trade name, available from Sumitomo 3M Limited), Asahi Guard AG710 and SURFLON S-382, SC101, SC102, SC103, SC104, SC105, and SC106 (trade name, available from Asahi Glass Co., Ltd.); and Organosiloxane Polymer KP341 (available from Shin-Etsu Chemical Co., Ltd.).

The amount of such a surfactant is generally 2.0% by mass or less, preferably 1.0% by mass or less, relative to the total solid content of the resist underlayer film-forming composition for lithography of the present invention. These surfactants may be incorporated alone or in combination of two or more species.

Examples of the solvent that can be used for dissolving, for example, the aforementioned polymer, crosslinking agent component, and crosslinking catalyst in the present invention include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These organic solvents may be used alone or in combination of two or more species.

Furthermore, high-boiling-point solvents such as propylene glycol monobutyl ether and propylene glycol monobutyl ether acetate may be used in combination. Of these solvents, for example, propylene glycol monomethyl ether, propylene glycol monomethyl ether acetate, ethyl lactate, butyl lactate, and cyclohexanone are preferred in view of an improvement of leveling property.

The resist used in the present invention is a photoresist or an electron beam resist.

In the present invention, the photoresist applied onto the resist underlayer film for lithography may be either of negative and positive photoresists. Examples of the photoresist include a positive photoresist formed of a novolac resin and a 1,2-naphthoquinone diazide sulfonic acid ester; a chemically amplified photoresist formed of a binder having a group that decomposes with an acid to thereby increase an alkali dissolution rate and a photoacid generator; a chemically amplified photoresist formed of an alkali-soluble binder, a low-molecular-weight compound that decomposes with an acid to thereby increase the alkali dissolution rate of the photoresist, and a photoacid generator; a chemically amplified photoresist formed of a binder having a group that decomposes with an acid to thereby increase an alkali dissolution rate, a low-molecular-weight compound that decomposes with an acid to thereby increase the alkali dissolution rate of the photoresist, and a photoacid generator; and a photoresist having an Si atom-containing skeleton. Specific examples of the photoresist include trade name APEX-E available from Rohm and Haas Company.

In the present invention, the electron beam resist applied onto the resist underlayer film for lithography is, for example, a composition containing a resin having an Si—Si bond in a main chain and an aromatic ring at a terminal, and an acid generator that generates an acid through irradiation with electron beams; or a composition containing poly(p-hydroxystyrene) wherein a hydroxy group is substituted with an N-carboxyamine-containing organic group, and an acid generator that generates an acid through irradiation with electron beams. In the latter electron beam resist composition, an acid generated from the acid generator through irradiation with electron beams reacts with an N-carboxyaminoxy group at a side chain of the polymer, and the polymer side chain decomposes into a hydroxy group, exhibits alkali solubility, and dissolves in an alkaline developer, to thereby form a resist pattern. Examples of the acid generator that generates an acid through irradiation with electron beams include halogenated organic compounds, such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl)pyridine; onium salts, such as triphenylsulfonium salts and diphenyliodonium salts; and sulfonic acid esters, such as nitrobenzyl tosylate and dinitrobenzyl tosylate.

Examples of the developer for the resist having the resist underlayer film formed from the resist underlayer film-forming composition for lithography of the present invention include aqueous solutions of alkalis, for example, inorganic alkalis, such as sodium hydroxide, potassium hydroxide, sodium carbonate, sodium silicate, sodium metasilicate, and aqueous ammonia, primary amines, such as ethylamine and n-propylamine, secondary amines, such as diethylamine and di-n-butylamine, tertiary amines, such as triethylamine and methyldiethylamine, alcoholamines, such as dimethylethanolamine and triethanolamine, quaternary ammonium salts, such as tetramethylammonium hydroxide, tetraethylammonium hydroxide, and choline, and cyclic amines, such as pyrrole and piperidine.

The developer to be used may be prepared by addition of an appropriate amount of an alcohol (e.g., isopropyl alcohol) or a surfactant (e.g., a nonionic surfactant) to any of the aforementioned aqueous alkali solutions. Among these developers, quaternary ammonium salts are preferred, and tetramethylammonium hydroxide and choline are more preferred.

Next will be described a method for forming a resist pattern in the present invention. Firstly, the resist underlayer film-forming composition is applied onto a substrate used for the production of a precise integrated circuit element (e.g., a transparent substrate, such as a silicon/silicon dioxide coating, a glass substrate, or an ITO substrate) by an appropriate coating method using, for example, a spinner or a coater. Thereafter, the composition is baked and cured to thereby form a coating underlayer film. The thickness of the resist underlayer film is preferably 0.01 to 3.0 m. The baking after application of the composition is performed at 80 to 400° C. for 0.5 to 120 minutes. Thereafter, a resist is applied directly onto the resist underlayer film, or if necessary, the resist is applied after formation of one to several layers of coating material on the coating underlayer film. Subsequently, the resist can be irradiated with light or electron beams through a predetermined mask, followed by development, rinsing, and drying, to thereby form a good resist pattern. Post exposure bake (PEB) may optionally be performed after the irradiation with light or electron beams. The resist underlayer film at a portion where the resist has been developed and removed in the aforementioned step can be removed by dry etching, to thereby form a desired pattern on the substrate.

The exposure light used for the aforementioned photoresist is actinic rays, such as near-ultraviolet rays, far-ultraviolet rays, or extreme-ultraviolet rays (e.g., EUV, wavelength: 13.5 nm); for example, light having a wavelength of 248 nm (KrF laser beam), 193 nm (ArF laser beam), or 157 nm (F2 laser beam). No particular limitation is imposed on the usable photoirradiation method, so long as the method can generate an acid from a photoacid generator. The dose of the exposure light is 1 to 2,000 mJ/cm$^2$, or 10 to 1,500 mJ/cm$^2$, or 50 to 1,000 mJ/cm$^2$.

The electron beam resist can be irradiated with electron beams by using, for example, an electron beam irradiation apparatus.

In the present invention, a semiconductor device can be produced through a step of forming a resist underlayer film on a semiconductor substrate from the resist underlayer film-forming composition; a step of forming a resist film on the resist underlayer film; a step of irradiating the resist film with light or electron beams, and developing the resist film, to thereby form a resist pattern; a step of etching the resist underlayer film with the formed resist pattern; and a step of processing the semiconductor substrate with the patterned resist underlayer film.

In the future, the formation of a finer resist pattern will cause a problem in terms of resolution and a problem in that the resist pattern collapses after development, and a decrease in the thickness of a resist will be demanded. Thus, it is difficult to form a resist pattern having a thickness sufficient for processing of a substrate. This requires a process for imparting a mask function, during the substrate processing, not only to the resist pattern, but also to a resist underlayer film that is formed between the resist and the semiconductor substrate to be processed. The resist underlayer film required for such a process is not a conventional resist underlayer film having a high etching rate, but a resist underlayer film for lithography having a selection ratio of dry etching rate similar to that of the resist, a resist underlayer film for lithography having a smaller selection ratio of dry etching rate than the resist, or a resist underlayer film for lithography having a smaller selection ratio of dry etching rate than the semiconductor substrate. Such a resist underlayer film may be provided with an anti-reflective performance; i.e., the film may also have the function of a conventional anti-reflective coating.

Meanwhile, a finer resist pattern has started to be formed by using a process for making a resist pattern and a resist underlayer film thinner than the pattern width during the resist development by dry etching of the resist underlayer film. The resist underlayer film required for such a process is not a conventional anti-reflective coating having a high etching rate, but a resist underlayer film having a selection ratio of dry etching rate similar to that of the resist. Such a resist underlayer film may be provided with an anti-reflective performance; i.e., the film may also have the function of a conventional anti-reflective coating.

In the present invention, after formation of the resist underlayer film of the present invention on a substrate, a resist may be applied directly to the resist underlayer film, or if necessary, the resist may be applied after formation of one to several layers of coating material on the resist underlayer film. This process reduces the pattern width of the resist. Thus, even when the resist is thinly applied for prevention of pattern collapse, the substrate can be processed with an appropriately selected etching gas.

Specifically, a semiconductor device can be produced through a step of forming a resist underlayer film on a semiconductor substrate from the resist underlayer film-forming composition; a step of forming, on the resist underlayer film, a hard mask from a coating material containing, for example, a silicon component or a hard mask (e.g., from silicon nitride oxide) by vapor deposition; a step of forming a resist film on the hard mask; a step of forming a resist pattern by irradiation with light or electron beams and development; a step of etching the hard mask with the formed resist pattern by using a halogen-containing gas; a step of etching the resist underlayer film with the patterned hard mask by using an oxygen-containing gas or a hydrogen-containing gas; and a step of processing the semiconductor substrate with the patterned resist underlayer film by using a halogen-containing gas.

In consideration of the effect of the resist underlayer film-forming composition for lithography of the present invention as an anti-reflective coating, since the light-absorbing moiety is incorporated into the skeleton of the film, the film does not diffuse any substance in the photoresist during heating and drying. The resist underlayer film exhibits high anti-reflective effect, since the light-absorbing moiety has sufficiently high light absorption performance.

The resist underlayer film-forming composition for lithography of the present invention has high thermal stability, and thus can prevent pollution of an upper-layer film caused by a decomposed substance during baking. Also, the composition can provide a temperature margin in a baking step.

Depending on process conditions, the resist underlayer film-forming composition for lithography of the present invention can be used as a film having the function of preventing light reflection and the function of preventing the interaction between the substrate and the photoresist or preventing the adverse effect, on the substrate, of a material used for the photoresist or a substance generated during the exposure of the photoresist to light.

EXAMPLES

The present invention will next be described in more detail by way of examples. However, the present invention should not be construed as being limited to the following examples.

Example 1

A 300-mL four-necked flask was charged with 41.98 g (0.161 mol) of N,N'-diphenyl-1,4-phenylenediamine (available from Tokyo Chemical Industry Co., Ltd.), 31.02 g (0.161 mol) of 4-amyloxybenzaldehyde (available from Tokyo Chemical Industry Co., Ltd.), 94.75 g (0.537 mol) of 4-(tert-butoxy)styrene (available from Wako Pure Chemical Industries, Ltd.), and 172.37 g of propylene glycol monomethyl ether (available from Kanto Chemical Co., Inc.). To the mixture was added 4.65 g (0.048 mol) of methanesulfonic acid (available from Tokyo Chemical Industry Co., Ltd.), and the resultant mixture was stirred and heated to 135° C. for dissolution and initiation of polymerization. After the elapse of 18 hours, the mixture was left to cool to room temperature, and then a solvent mixture of 1,000 g of methanol (available from Kanto Chemical Co., Inc.), 1,000 g of ultrapure water, and 100 g of 30% aqueous ammonia (available from Kanto Chemical Co., Inc.) was added to the mixture for reprecipitation. The resultant precipitate was filtered and then dried with a reduced pressure dryer at 80° C. for 24 hours, to thereby prepare 136.68 g of a target polymer (having a repeating unit structure of Formula (3-15) and a structural group of Formula (C-15) at the polymer end). This polymer will be hereinafter abbreviated as "pDPPDA-AOBA-TBOS."

pDPPDA-AOBA-TBOS was found to have a weight average molecular weight Mw of 1,400 as determined by GPC in terms of polystyrene and a polydispersity Mw/Mn of 1.29.

Subsequently, 1.00 g of the thus-prepared novolac resin (pDPPDA-AOBA-TBOS), 0.20 g of tetramethoxymethyl glycoluril (product name: POWDERLINK [registered trademark] 1174, available from Cytec Industries Japan) serving as a crosslinking agent, 0.030 g of K-PURE TAG-2689 (available from King Industries Inc.) serving as a crosslinking catalyst, and 0.001 g of a surfactant (product name: MEGAFAC [trade name]R-30N, available from DIC Corporation, fluorine-containing surfactant) were dissolved in 7.00 g of propylene glycol monomethyl ether and 16.36 g of propylene glycol monomethyl ether acetate, to thereby prepare a resist underlayer film-forming composition.

Example 2

1.00 g of pDPPDA-AOBA-TBOS as a polymer, 0.20 g of 2,2-bis[3,5-bis[(2-methoxy-1-methylethoxy)methyl]-4-hydroxyphenyl]propane (compound prepared by dehydration and condensation of four methylol groups of Formula (4-20) with propylene glycol monomethyl ether, abbreviated as "PGME-BIP-A" and shown by Formula (5-1)) serving as a crosslinking agent, 0.020 g of pyridinium-p-phenolsulfonate serving as a crosslinking catalyst (acid catalyst), and 0.001 g of a surfactant (product name: MEGAFAC [trade name] R-30N, available from DIC Corporation, fluorine-containing surfactant) were dissolved in 7.00 g of propylene glycol monomethyl ether and 16.36 g of propylene glycol monomethyl ether acetate, to thereby prepare a resist underlayer film-forming composition.

Formula (5-1)

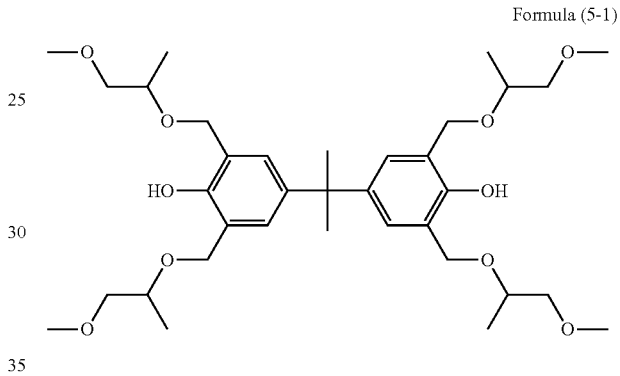

Comparative Example 1

A 100-mL four-necked flask was charged with 15.94 g (0.094 mol) of diphenylamine (available from Tokyo Chemical Industry Co., Ltd.), 10.00 g (0.094 mol) of benzaldehyde (available from Tokyo Chemical Industry Co., Ltd.), and 62 g of propylene glycol monomethyl ether (available from Kanto Chemical Co., Inc.). To the mixture was added 0.45 g (0.005 mol) of methanesulfonic acid (available from Tokyo Chemical Industry Co., Ltd.), and the resultant mixture was stirred and heated to 135° C. for dissolution and initiation of polymerization. After the elapse of one hour, the mixture was left to cool to room temperature, and then 800 g of methanol (available from Kanto Chemical Co., Inc.) was added to the mixture for reprecipitation. The resultant precipitate was filtered and then dried with a reduced pressure dryer at 80° C. for 24 hours, to thereby prepare 15.07 g of a target polymer (corresponding to Formula (6-1), no addition reaction at the polymer end with the aromatic vinyl compound (B), hereinafter will be abbreviated as "pDPA-BA").

pDPA-BA was found to have a weight average molecular weight Mw of 4,100 as determined by GPC in terms of polystyrene and a polydispersity Mw/Mn of 2.22.

Subsequently, 1.00 g of the thus-prepared novolac resin, 0.20 g of 3,3',5,5'-tetramethoxymethyl-4,4'-bisphenol (trade name: TMOM-BP, available from Honshu Chemical Industry Co., Ltd., Formula (4-23)) serving as a crosslinking agent, 0.030 g of pyridinium p-phenolsulfonate serving as a crosslinking catalyst, and 0.001 g of a surfactant (product name: MEGAFAC [trade name] R-30N, available from DIC Corporation, fluorine-containing surfactant) were dissolved in 2.63 g of propylene glycol monomethyl ether and 6.14 g of propylene glycol monomethyl ether acetate, to thereby prepare a resist underlayer film-forming composition.

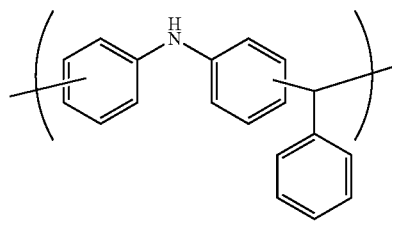

Formula (6-1)

Comparative Example 2

A 100-mL four-necked flask was charged with 17.53 g (0.080 mol) of N-phenyl-1-naphthylamine (available from Tokyo Chemical Industry Co., Ltd.), 8.49 g (0.080 mol) of benzaldehyde (available from Tokyo Chemical Industry Co., Ltd.), and 62 g of propylene glycol monomethyl ether acetate (available from Kanto Chemical Co., Inc.). To the mixture was added 0.77 g (0.008 mol) of methanesulfonic acid (available from Tokyo Chemical Industry Co., Ltd.), and the resultant mixture was stirred and heated to 135° C. for dissolution and initiation of polymerization. After the elapse of 30 minutes, the mixture was left to cool to room temperature and then diluted with 18 g of tetrahydrofuran (THF) (available from Kanto Chemical Co., Inc.), and 800 g of methanol (available from Kanto Chemical Co., Inc.) was added to the mixture for reprecipitation. The resultant precipitate was filtered and then dried with a reduced pressure dryer at 80° C. for 24 hours, to thereby prepare 21.04 g of a target polymer (corresponding to Formula (7-1), no addition reaction at the polymer end with the aromatic vinyl compound (B), hereinafter will be abbreviated as "pNP1NA-BA").

pNP1NA-BA was found to have a weight average molecular weight Mw of 3,700 as determined by GPC in terms of polystyrene and a polydispersity Mw/Mn of 2.14.

Subsequently, 1.00 g of the thus-prepared novolac resin, 0.20 g of 3,3',5,5'-tetramethoxymethyl-4,4'-bisphenol (trade name: TMOM-BP, available from Honshu Chemical Industry Co., Ltd., Formula (4-23)) serving as a crosslinking agent, 0.030 g of pyridinium p-phenolsulfonate serving as a crosslinking catalyst, and 0.001 g of a surfactant (product name: MEGAFAC [trade name] R-30N, available from DIC Corporation, fluorine-containing surfactant) were dissolved in 2.63 g of propylene glycol monomethyl ether and 6.14 g of propylene glycol monomethyl ether acetate, to thereby prepare a resist underlayer film-forming composition.

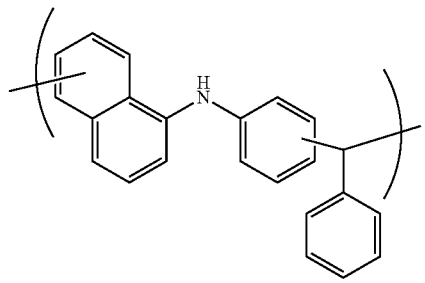

Formula (7-1)

Comparative Example 3

22.06 g of 1.4-dioxane and 22.06 g of toluene were added to 10.00 g of phenyl-1-naphthylamine, 10.50 g of 1-pyrenecarboxaldehyde, 8.04 g of 4-tert-butoxystyrene, and 0.88 g of methanesulfonic acid, and the mixture was stirred in a nitrogen atmosphere under reflux for 17 hours. The resultant reaction mixture was added dropwise to methanol. The precipitated resin was filtered and washed, and then dried under reduced pressure at 70° C., to thereby prepare 11.44 g of a resin having a structure of Formula (8-1).

The resin was found to have a weight average molecular weight of 1,400 as determined by GPC in terms of standard polystyrene.

Subsequently, 1.00 g of the thus-prepared resin, 0.20 g of tetramethoxymethyl glycoluril (product name: POWDER-LINK [registered trademark] 1174, available from Cytec Industries Japan) serving as a crosslinking agent, 0.030 g of K-PURE TAG-2689 (available from King Industries Inc.) serving as a crosslinking catalyst, and 0.002 g of a surfactant (product name: MEGAFAC, trade name: R-40, available from DIC Corporation, fluorine-containing surfactant) were dissolved in 13.30 g of propylene glycol monomethyl ether and 5.70 g of propylene glycol monomethyl ether acetate, to thereby prepare a resist underlayer film-forming composition.

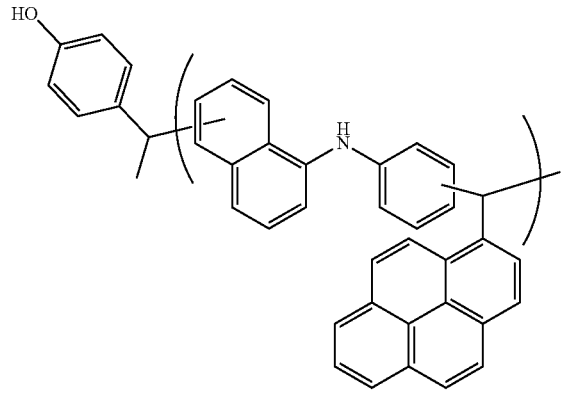

Formula (8-1)

[Optical Constant and Selection Ratio of Etching Rate]

Each of the resist underlayer film-forming compositions prepared in Examples 1 and 2 and Comparative Examples 1 to 3 was applied onto a silicon wafer and heated on a hot plate at 400° C. for 90 seconds, to thereby form a resist underlayer film. The refractive index and attenuation coefficient of the resist underlayer film were measured at 193 nm.

The refractive index and the attenuation coefficient were measured with an ellipsometer (VUV-VASE) available from J. A. Woollam Japan.

Each of the resist underlayer film-forming compositions prepared in Examples 1 and 2 and Comparative Examples 1 to 3 was applied onto a silicon wafer and heated on a hot plate at 400° C. for 90 seconds, to thereby form a resist underlayer film. The dry etching rate of the resist underlayer film was compared with that of a resist film formed from a resist solution (product name: SUMIRESIST PAR855) available from Sumitomo Chemical Company, Limited.

The dry etching rate (with respect to CF4 gas) was measured with a dry etching apparatus (RIE-10NR) available from SAMCO Inc.

Table 1 shows the refractive index (n-value) and attenuation coefficient (k-value) of the resist underlayer film, and the ratio of dry etching rate (selection ratio of dry etching rate).

The selection ratio of dry etching rate=(the dry etching rate of each resist underlayer film)/(the dry etching rate of the resist film)

TABLE 1

| | Refractive index (n-value) | Attenuation coefficient (k-value) | Wavelength (nm) | Selection ratio of dry etching rate |
|---|---|---|---|---|
| Example 1 | 1.46 | 0.53 | 193 | 0.99 |
| Example 2 | 1.44 | 0.52 | 193 | 1.06 |
| Comparative Example 1 | 1.50 | 0.59 | 193 | 0.76 |
| Comparative Example 2 | 1.45 | 0.55 | 193 | 0.75 |
| Comparative Example 3 | 1.44 | 0.54 | 193 | 0.86 |

As shown in the results of Table 1, the resist underlayer film formed from the resist underlayer film-forming composition of the present invention exhibits an appropriate anti-reflective effect. When a resist film is formed on the resist underlayer film formed from the resist underlayer film-forming composition of the present invention, a resist pattern is formed through light exposure and development, and then a substrate is subjected to dry etching with the resist pattern by using, for example, an etching gas, the substrate can be processed since the resist underlayer film of the present invention exhibits a dry etching rate higher than that of the resist film.

[Test for Coating of Stepped Substrate]

For evaluation of coating of a stepped substrate, the thicknesses of portions of a coating film were compared on an SiO$_2$ substrate having a thickness of 200 nm and having a dense patterned area (DENSE) (trench width: 50 nm, pitch: 100 nm) and a non-patterned open area (OPEN). Each of the resist underlayer film-forming compositions of Examples 1 and 2 and Comparative Examples 1 and 2 was applied onto the aforementioned substrate, and then baked at 400° C. for 90 seconds, so as to form a film having a thickness of 150 nm. For evaluation of coating of the stepped substrate (planarity), the substrate was observed with a scanning electron microscope (S-4800) available from Hitachi High-Technologies Corporation, followed by measurement of the difference between the thickness of the substrate at the dense area (patterned area) and that at the open area (non-patterned area) (i.e., the difference in coating level between the dense area and the open area, which is called "Bias"). Table 2 shows the thicknesses of these areas and the difference in coating level. The Bias is used for evaluation of the planarity; i.e., the smaller the Bias, the higher the planarity.

TABLE 2

| | DENSE Thickness (nm) | OPEN Thickness (nm) | DENSE/OPEN Difference in coating level (nm) |
|---|---|---|---|
| Example 1 | 115 nm | 141 nm | 26 nm |
| Example 2 | 107 nm | 133 nm | 26 nm |
| Comparative Example 1 | 70 nm | 143 nm | 73 nm |
| Comparative Example 2 | 75 nm | 145 nm | 70 nm |
| Comparative Example 3 | 71 nm | 149 nm | 78 nm |

The results of comparison of coating of the stepped substrate show that the difference in coating level between the patterned area and the open area in Examples 1 and 2 is smaller than that in Comparative Examples 1 and 3. Thus, the resist underlayer film formed from the resist underlayer film-forming composition of Example 1 or 2 exhibits good planarity.

In the method of forming the resist underlayer film through application of the resist underlayer film-forming composition of the present invention onto a semiconductor substrate and baking of the composition, the difference in coating level between the patterned area and the non-patterned area of the substrate can be adjusted to 10 to 60 nm, or 10 to 50 nm, or 10 to 30 nm.

In particular, the present invention can provide a resist underlayer film-forming composition that can form a resist underlayer film exhibiting a good balance between thermal resistance, planarization, and etching resistance.

INDUSTRIAL APPLICABILITY

The present invention can provide a composition for forming a resist underlayer film which exhibits improved pattern fillability during baking by improving the thermal reflow property of a polymer contained in the composition, and which prevents mixing during application of a photoresist composition or formation of a different resist underlayer film.

The invention claimed is:

1. A resist underlayer film-forming composition comprising a novolac resin having a structural group (C) formed by reaction between an aromatic ring of an aromatic compound (A) having at least two amino groups and three $C_{6-40}$ aromatic rings and a vinyl group of an aromatic vinyl compound (B), wherein the aromatic compound (A) is a novolac resin prepared by reaction of a compound having at least two amino groups and at least three $C_{6-40}$ aromatic rings with an aldehyde or a ketone.

2. The resist underlayer film-forming composition according to claim 1, wherein the structural group (C) is a group of the following Formula (1):

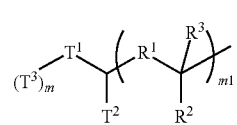

Formula (1)

wherein
R¹ is a divalent group containing at least two amino groups and at least three $C_{6-40}$ aromatic rings;
R² and R³ are each independently a hydrogen atom, a $C_{1-10}$ alkyl group, a $C_{6-40}$ aryl group, a heterocyclic group, or any combination of these; the alkyl group, the aryl group, and the heterocyclic group are each an organic group optionally substituted with a halogen atom, a nitro group, an amino group, a $C_{1-10}$ alkyl group, a $C_{6-40}$ aryl group, a formyl group, a carboxyl group, an alkoxy group, or a hydroxy group; and R² and R³ optionally form a ring together with the carbon atom to which they are bonded;
T¹ is a $C_{6-40}$ arylene group;
T³ is a $C_{1-10}$ alkyl group, a $C_{2-10}$ alkenyl group, a $C_{2-10}$ alkynyl group, a $C_{6-40}$ aryl group, a hydroxy group, a cyano group, a nitro group, an amino group, a carboxyl group, an acetyl group, a hydroxymethyl group, a halogenomethyl group, a —Y—Z group, a halogen atom, or any combination of these; Y is an oxygen atom, a sulfur atom, a carbonyl group, or an ester group; and Z is a $C_{1-10}$ alkyl group;
T² is a hydrogen atom, a methyl group, or a phenyl group;
m is an integer of 0 to (5+2n);
n is the degree of condensation of an aromatic ring forming the arylene group defined by T¹; and
m1 is an integer of 2 to 3,600.

3. The resist underlayer film-forming composition according to claim 2, wherein R¹ is a divalent organic group prepared by removal of two hydrogen atoms from aromatic rings of a compound of the following Formula (2):

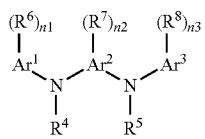

Formula (2)

wherein
Ar¹, Ar², and Ar³ are each independently a benzene ring or a naphthalene ring;
R⁶, R⁷, and R⁸ are each independently a substituent on the corresponding ring and selected from the group consisting of a halogen atom, a nitro group, an amino group, a hydroxy group, a $C_{1-10}$ alkyl group, a $C_{2-10}$ alkenyl group, a $C_{6-40}$ aryl group, and any combination of these; and the alkyl group, the alkenyl group, and the aryl group are each an organic group optionally containing an ether bond, a ketone bond, or an ester bond;
R⁴ and R⁵ are each independently selected from the group consisting of a hydrogen atom, a $C_{1-10}$ alkyl group, a $C_{2-10}$ alkenyl group, a $C_{6-40}$ aryl group, and any combination of these; and the alkyl group, the alkenyl group, and the aryl group are each an organic group optionally containing an ether bond, a ketone bond, or an ester bond; and
n1, n2, and n3 are an integer of 0 to the number of maximum substitutions of R⁶, R⁷, and R⁸, respectively.

4. The resist underlayer film-forming composition according to claim 2, wherein R¹ is a divalent organic group prepared by removal of two hydrogen atoms from aromatic rings of N,N-diphenyl-1,4-phenylenediamine.

5. The resist underlayer film-forming composition according to claim 2, wherein R³ is a hydrogen atom; and
R² is an aryl group selected from a phenyl group, a naphthyl group, an anthryl group, and a pyrenyl group, and the aryl group is optionally substituted with a halogen atom, a nitro group, an amino group, a $C_{1-10}$ alkyl group, a $C_{1-10}$ alkoxy group, a $C_{6-40}$ aryl group, a formyl group, a carboxyl group, or a hydroxy group.

6. The resist underlayer film-forming composition according to claim 2, wherein R³ is a hydrogen atom; and
R² is a phenyl group, and the phenyl group is optionally substituted with a halogen atom, a nitro group, an amino group, a $C_{1-10}$ alkyl group, a $C_{1-10}$ alkoxy group, a $C_{6-40}$ aryl group, a formyl group, a carboxyl group, or a hydroxy group.

7. The resist underlayer film-forming composition according to claim 2, wherein T¹ is a phenylene group.

8. The resist underlayer film-forming composition according to claim 2, wherein the structural group (C) is a group of the following Formula (1-1):

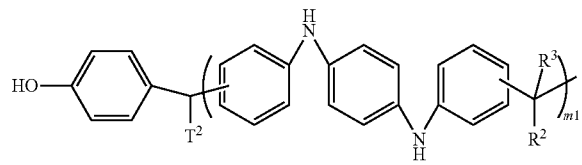

Formula (1-1)

wherein
R² and R³ are each independently a hydrogen atom, a $C_{1-10}$ alkyl group, a $C_{6-40}$ aryl group, a heterocyclic group, or any combination of these; the alkyl group, the aryl group, and the heterocyclic group are each an organic group optionally substituted with a halogen atom, a nitro group, an amino group, a $C_{1-10}$ alkyl group, a $C_{6-40}$ aryl group, a formyl group, a carboxyl group, an alkoxy group, or a hydroxy group; and R² and R³ optionally form a ring together with the carbon atom to which they are bonded;
T² is a hydrogen atom, a methyl group, or a phenyl group; and
m1 is an integer of 2 to 3,600.

9. The resist underlayer film-forming composition according to claim 1, wherein the composition further comprises a crosslinking agent.

10. The resist underlayer film-forming composition according to claim 1, wherein the composition further comprises an acid and/or an acid generator.

11. A resist underlayer film formed by applying the resist underlayer film-forming composition according to claim 1 onto a semiconductor substrate, and then baking the composition.

12. A method for producing a semiconductor device, the method comprising
a step of forming, on a semiconductor substrate, a resist underlayer film from the resist underlayer film-forming composition according to claim 1;
a step of forming a resist film on the resist underlayer film;
a step of irradiating the resist film with light or electron beams, and then developing the resist film, to thereby form a resist pattern;

a step of etching the resist underlayer film with the formed resist pattern; and a step of processing the semiconductor substrate with the patterned resist underlayer film.

13. A method for producing a semiconductor device, the method comprising a step of forming, on a semiconductor substrate, a resist underlayer film from the resist underlayer film-forming composition according to claim 1;

a step of forming a hard mask on the resist underlayer film; a step of forming a resist film on the hard mask;

a step of irradiating the resist film with light or electron beams, and then developing the resist film, to thereby form a resist pattern;

a step of etching the hard mask with the formed resist pattern;

a step of etching the resist underlayer film with the patterned hard mask; and a step of processing the semiconductor substrate with the patterned resist underlayer film.

* * * * *